(12) United States Patent
Yamazaki et al.

(10) Patent No.: US 8,115,201 B2
(45) Date of Patent: Feb. 14, 2012

(54) SEMICONDUCTOR DEVICE WITH OXIDE SEMICONDUCTOR FORMED WITHIN

(75) Inventors: Shunpei Yamazaki, Setagaya (JP); Hidekazu Miyairi, Isehara (JP); Akiharu Miyanaga, Hadano (JP); Kengo Akimoto, Atsugi (JP); Kojiro Shiraishi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/535,714

(22) Filed: Aug. 5, 2009

(65) Prior Publication Data

US 2010/0032667 A1 Feb. 11, 2010

(30) Foreign Application Priority Data

Aug. 8, 2008 (JP) .................... 2008-206125

(51) Int. Cl.
*H01L 29/786* (2006.01)
*H01L 21/336* (2006.01)

(52) U.S. Cl. ....... 257/43; 257/57; 257/66; 257/E29.068; 438/104; 438/158

(58) Field of Classification Search ............ 257/43, 257/57, 66, E29.068; 438/104, 158
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

EP 1737044 A 12/2006

(Continued)

OTHER PUBLICATIONS

Fortunato.E et al., "Wide-Bandgap High-Mobility ZnO Thin-Film Transistors Produced At Room Temperature," Appl. Phys. Lett. (Applied Physics Letters, Sep. 27, 2004, vol. 85, No. 13, pp. 2541-2543.

(Continued)

*Primary Examiner* — Hung Vu
*Assistant Examiner* — Vernon P Webb
(74) *Attorney, Agent, or Firm* — Eric J. Robinson; Robinson Intellectual Property Law Office, P.C.

(57) ABSTRACT

One of the objects of the present invention is to provide a thin film transistor using an oxide semiconductor film containing indium (In), gallium (Ga), and zinc (Zn), in which the contact resistance between the oxide semiconductor layer and a source and drain electrodes is reduced, and to provide a method for manufacturing the thin film transistor. An ohmic contact is formed by intentionally providing a buffer layer having a higher carrier concentration than the IGZO semiconductor layer between the IGZO semiconductor layer and the source and drain electrode layers.

16 Claims, 25 Drawing Sheets

U.S. PATENT DOCUMENTS

| | | | |
|---|---|---|---|
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 * | 3/2007 | Akimoto et al. ............ 438/795 |
| 2007/0090365 | A1 | 4/2007 | Hayashi et al. |
| 2007/0108446 | A1 | 5/2007 | Akimoto et al. |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2007-096055 | | 4/2007 |
| JP | 2007-123861 | | 5/2007 |
| JP | 2007-165861 | | 6/2007 |
| WO | WO-2004/114391 | | 12/2004 |

OTHER PUBLICATIONS

Dembo.H et al., RFCPUS on Glass and Plastic Substrates Fabricated by TFT Transfer Technology, , IEDM 05: Technical Digest of International Electron Devices Meeting, Dec. 5, 2005, pp. 1067-1069.

Ikeda.T et al., "Full-Functional System Liquid Crystal Display Using CG-Silicon Technology," SID Digest '04 : SID International Symposium Digest of Technical Papers, 2004, vol. 35, 860-863.

Nomura.K et al., "Room-Temperature Fabrication of Transparent Flexible Thin-Film Transistors Using Amorphous Oxide Semiconductors," Nature, Nov. 25, 2004, vol. 432, pp. 488-492.

Park.J et al., Improvements in the Device Characteristics of Amorphous Indium Gallium Zinc Oxide Thin-Film Transistors ny Ar Plasma Treatment, , Appl. Phys. Lett. (Applied Physics Letters, Jun. 26, 2007, vol. 90, No. 26, pp. 262106-1-26106-3.

Takahashi.M et al., "Theoretical Analysis of IGZO Transparent Amorphous Oxide Semiconductor," IDW '08: Proceedings of the 15th International Display Workshops, Dec. 3, 2008, pp. 1637-1640.

Hayashi.R et al. "42.1: Invited Paper: Improved Amorphpus In-Ga-Zn-OTFTS," SID Digest '08 : SID International Symposium Digest of Technical Papers, May 20, 2008, vol. 39, pp. 621-624.

Prins.M et al., "A Ferroelectric Transparent Thin-FIlm Transistor,", Appl. Phys. Lett. (Applied Physics Letters, Jun. 17, 1996, vol. 68, No. 25, pp. 3560-3652.

Nakamura.M et al., "The phase relations in the $In_2O_3$-$Ga_2ZnO_4$-ZnO systems at 1350 ° C,", Journal of Solid State Chemistry, Aug. 1, 1991, vol. 93, No. 2, pp. 298-315.

Kimizuka.N et al., "Syntheses and Single Crystal Data of Homologus Compounds, $In_2O_3(ZnO)_m$ (m = 3, 4, and 5), $InGaO_3(ZnO)_3$, and $Ga_2O_3(ZnO)_m$ (m = 7,8,9 and 16) in the $In_2O_3$-$ZnGa_2O_4$-ZnO Sytem," Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor," Science, May 23, 2003, vol. 300, No. 5623, pp. 1269-1272.

Masuda.S et al., "Transparent thin film transistors using ZnO as an active channel layer and their electrical properties," J. Appl. Phys. (Journal of Applied Physics, Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada.T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films," Appl. Phys. Lett. (Applied Physics Letters, Sep. 13, 2004, vol. 85, No. 11, pp. 1993-1995.

Li.C et al., "Modulated Structures of Homologus Compounds $InMO_3(ZnO)_m$ (M=In, Ga; m=Interger) Described by Four-Dimensional Superspace Group," Journal of Solid Sate Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Lee.J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDS," SID Digest '09: SID International Symposium Digest of Technical Papers, May 31, 2009, vol. 40, pp. 899-902.

Kanno.H et al., "White Stacked Electrophosphorescent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs," IDW '02 : Proceedings of The 9th International Display Workshops, Dec. 4, 2002, pp. 295-298.

Van De Walle.C, "Hydrogen as a Cause of Doping in Zinc Oxide," Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong.J et al., "3.1: Distinguished Paper 12.1-Inch WXGA AMOLED Display Driven by Indium-Gallium-Zinc Oxide TFTS Array," SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure," IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems," Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display," AM-FPD '09 Digest of Technical Papers, Jul. 9, 2009, pp. 227-230, The Japan Society of Applied Physics.

Coates.D et al., Optical Studies of the Amorphous Liquid-Cholesteric Liquid Crystal Transition:The "Blue Phase", Physics Letters, Sep. 10, 1973, vol. 45A, No. 2, pp. 115-116.

Cho.D et al., "21.2:AL and SN-DOPED Zinc Indium Oxide Thin Film Transistors for AMOLED Back-Plane," SID Digest '09: SID International Symposium Digest of Technical papers, May 31, 2009, pp. 280-283.

Lee.M et al., "15.4:Excellent Performance of Indium-Oxide-Based Thin-Film Transistors by DC Sputtering," SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 21, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top Gate Zinc Oxide Thin-Film Transistors (ZNO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on their way to business," SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors," IEEE Transactions on Electron Devices, Jul. 2, 1995, vol. 42, No. 7, pp. 1240-1246.

Kikuchi.H et al., "39,1: Invited Paper: Optically Isotropic Nano-Structured Liquid Crystal Composites for Display Applications," SID Digest '09 : SID International Symposium Digest of Technical papers, May 31, 2009, pp. 578-581.

Asaoka.Y et al., "29.1: Polarizer-Free Reflective LCD Combined With Ultra Low-Power Driving Technology," SID Digest '09 : SID International Symposium DIgest of Technical Papers, 2009, pp. 395-398.

Lee.H et al., "Current Status of, Challenges to, and Perspective View of AM-OLED ," IDW '06 : Proceedings of The 13th International Display Workshops, Dec. 7, 2008, pp.663-666.

Kikuchi.H et al., "62.2: Invited Paper: Fast Electro-Optical Switching in Polymer-Stabilized Liquid Crystalline Blue Phases for Display Application," SID Digest '07 : SID International Symposium Digest of The Technical Papers, 2007, vol. 38, pp. 1737-1740.

Nakamura, M., "Synthesis of Homlogus Compound with New Long-Period Structure," NIRIM Newsletter, Mar. 1, 1995, vol. 150, pp. 1-5.

Kikuchi.H et al., "Polymer-Stabilized Liquid Crystal Blue Phases," Nature Materials, Sep. 1, 2002, vol. 1, pp. 64-68.

Kimizuka.N. et al., "Spinel,$YBFE_2O_4$, and $YB_2FE_3O_7$ Types of Structures for Compounds in the $IN_2O_3$ and $SC_2O_3$-$A_2O_3$-BO Systems [A: FE, GA, or AL; B: MG, MN, FE, NI, CU, OR ZN] at Temperatures over 1000 ° C,", Journal of Solid State Chemistry, 1985, vol. 60, pp. 382-384.

Kitzerow.H et al., "Observation of Blue Phases in Chiral Networks," Liquid Crystals, 1983, vol. 14, No. 3, pp. 911-916.

Costello.M et al., "Electron Microscopy of a Cholesteric Liquid Crystal and Its Blue Phase," Phys, Rev. A (Physical Review. A), May 1, 1984, vol. 29, No. 5, pp. 2957-2959.

Meiboom.S et al., "Theory of the Blue Phase of Cholesteric Liquid Crystals," Phys. Rev. Lett. (Physical Review Letters), May 4, 1981, vol. 46, No, 18, pp. 1216-1219.

Park.Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita.M et al., "Mechanism of Electrical Conductivity of Transparent InGaZnO$_4$," Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors," JPn. J. Appl. Phys. (Japanese Journal of Applied Physics, 2006, vol. 45, No. 5B, pp. 4303-4308.

Janotti.A et al., "Native Point Defects in ZnO," Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor upon Exposure to Water," Appl. Phys. Lett. (Applied Physics Letters, 2008, vol. 92, pp. 072104-1-072104-3.

Hsieh.H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Janotti.A et al., "Oxygen Vacancies in ZnO," Appl. Phys. Lett. (Applied Physics Letters, 2005, vol. 87, pp. 122102-1-122102-3.

Oba.F et al., "Defect energetics in ZnO: A hybrid Hartree-Fock density functional study," Phys. Rev. B (Physical Review. B), 2008, vol. 77, pp. 245202-1-245202-6.

Orita.M et al., "Amorphous transparent conductive oxide InGaO$_3$(ZnO)$_m$ (m≦4):a Zn4s conductor," Philosophical Magazine, 2001, vol. 81, No. 5, pp. 501-515.

Hosono.H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays," IDW '08 : Proceedings of the 6th International Display Workshops, Dec. 3, 2008, pp. 581-584.

Kim.S et al., "High-Performance oxide thin film transistors passivated by various gas plasmas," 214th ECS Meeting, 2008, No. 2317.

Clark.S et al., "First Principles Methods Using CASTEP," Zeitschrift fur Kristallographie, 2005, vol. 220, pp. 567-570.

Lany.S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park.J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers," J. Electrochem. Soc. (Journal of the Electrochemical Society), 2008, vol. 155, No. 12, pp. H1009-H1014.

Ueno.K et al., "Field-Effect Transistor on SrTiO$_3$ With Sputtered Al$_2$O$_3$ Gate Insulator,", Appl. Phys Lett. (Applied Physics Letters, Sep. 1, 2003, vol. 83, No. 9, pp. 1755-1757.

Nakamura, M., "Synthesis of Homologous Compound with New Long-Period Structure," Nirim Newsletter, Mar. 1, 1995, vol. 150, pp. 1-4.

* cited by examiner

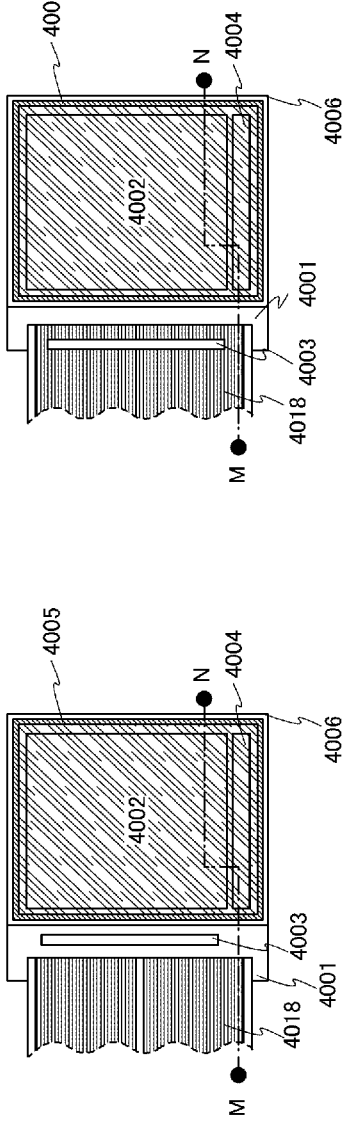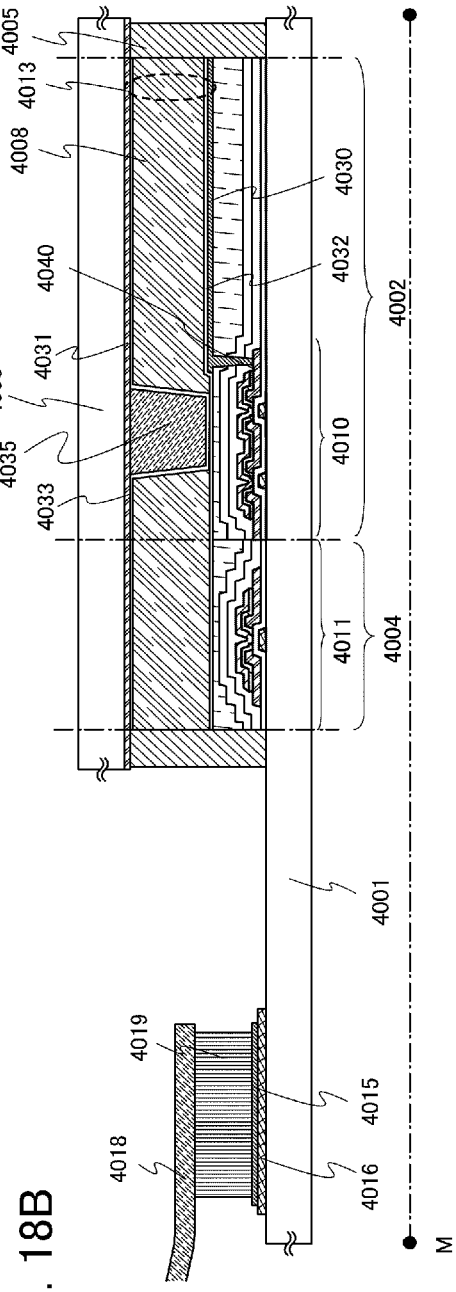

SEMICONDUCTOR DEVICE WITH OXIDE SEMICONDUCTOR FORMED WITHIN

BACKGROUND OF THE INVENTION

1. Field of the Invention

The present invention relates to a semiconductor device having a circuit including a thin film transistor (hereinafter, referred to as a TFT) in which a channel formation region is formed using an oxide semiconductor film, and a method for manufacturing the same. For example, the present invention relates to an electronic appliance in which an electro-optical device typified by a liquid crystal display panel or a light-emitting display device including an organic light-emitting element is mounted as its component.

Note that the semiconductor device in this specification indicates all the devices that can operate by using semiconductor characteristics, and an electro-optical device, a semiconductor circuit, and an electronic appliance are all included in the semiconductor devices.

2. Description of the Related Art

In recent years, active matrix display devices (such as liquid crystal display devices, light-emitting display devices, or electrophoretic display devices) in which a switching element of a TFT is provided in each of display pixels arranged in a matrix have been actively developed. An active matrix display device includes a switching element in each pixel (or each dot), which is advantageous in that it can be driven at lower voltage than a passive matrix display device in the case where the pixel density increases.

In addition, the technology, in which a thin film transistor (TFT) or the like is manufactured using an oxide semiconductor film in a channel formation region and such a TFT is applied to electronic devices or optical devices, has attracted attention. For example, there is a TFT using zinc oxide (ZnO) for an oxide semiconductor film or a TFT using $InGaO_3(ZnO)_m$ for an oxide semiconductor film. The technology, in which a TFT using such an oxide semiconductor film is formed over a light-transmitting substrate and used as a switching element or the like of an image display device, is disclosed in Reference 1 and Reference 2.

REFERENCE

[Patent Document]
Reference 1: Japanese Published Patent Application No. 2007-123861
Reference 2: Japanese Published Patent Application No. 2007-096055

SUMMARY OF THE INVENTION

For a thin film transistor in which a channel formation region is formed using an oxide semiconductor film, high speed operation, a comparatively-easy manufacturing process, and sufficient reliability are required.

In forming a thin film transistor, a metal material having a low resistance is used for a source and drain electrodes. In particular, in the case of manufacturing a display device having a large display area, the problem of signal delay due to wiring resistance becomes significant. Therefore, a metal material having a low electric resistance is preferably used as a material of a wiring or an electrode. On the other hand, in the case where the thin film transistor has a structure in which an oxide semiconductor film directly touches a source and drain electrodes made of a metal material having a low electric resistance, contact resistance might be high. As one of the factors causing high contact resistance, the following condition is given: Schottky junction is formed at the interface between the oxide semiconductor film and the source and drain electrodes.

In addition, capacitance is formed in a portion where the oxide semiconductor film and the source and drain electrodes are directly in contact with each other, and frequency characteristics (referred to as F characteristics) are lowered, which might hinder high-speed operation of the thin film transistor.

An object of one embodiment of the present invention is to provide a thin film transistor using an oxide semiconductor film containing indium (In), gallium (Ga), and zinc (Zn), in which the contact resistance between the oxide semiconductor layer and a source and drain electrodes is reduced, and to provide a method for manufacturing the thin film transistor.

Another object is to improve the operation characteristics and reliability of a thin film transistor using an oxide semiconductor film containing In, Ga, and Zn.

Another object is to reduce variations in electrical properties of thin film transistors each using an oxide semiconductor film containing In, Ga, and Zn. In particular, in a liquid crystal display device, in the case where there are large variations between elements, display unevenness due to the variations in TFT characteristics might be caused.

Also in a display device having a light-emitting element, in the case where there are large variations in ON current ($I_{on}$) of TFTs arranged so that a constant current flows to pixel electrodes (TFTs in a driver circuit or a pixel, which supply a current to a light-emitting element), the luminance of a display screen might be varied.

Thus, one embodiment of the present invention is made to solve at least one of the above problems.

The summary of one embodiment of the present invention is that an oxide semiconductor film containing In, Ga, and Zn is used as a semiconductor layer and a buffer layer is provided between the semiconductor layer and a source and drain electrode layers.

In this specification, a semiconductor layer formed using an oxide semiconductor film containing In, Ga, and Zn is also referred to as an "IGZO semiconductor layer".

An ohmic contact of an IGZO semiconductor layer and a source electrode layer is necessary and the contact resistance therebetween is preferably as low as possible. Similarly, an ohmic contact of the IGZO semiconductor layer and a drain electrode layer is necessary and the contact resistance therebetween is preferably as low as possible.

Therefore, an ohmic contact is formed by intentionally providing a buffer layer having a higher carrier concentration than the IGZO semiconductor layer between the IGZO semiconductor layer and the source and drain electrode layers.

For the buffer layer, an n-type oxide semiconductor film containing In, Ga, and Zn is used. The buffer layer may contain an impurity element imparting n-type conductivity. As the impurity element, it is possible to use, for example, magnesium, aluminum, titanium, iron, tin, calcium, germanium, scandium, yttrium, zirconium, hafnium, boron, thallium, or lead. A buffer layer containing magnesium, aluminum, titanium, or the like has a blocking effect against oxygen, and the oxygen concentration of the semiconductor layer can be kept within the optimal range by heat treatment or the like after film formation.

The buffer layer functions as an $n^+$ layer and can also be referred to as a drain region or a source region.

In order to reduce variations in electrical properties of the thin film transistors, it is preferable that the IGZO semiconductor layer be in an amorphous state.

One embodiment of a semiconductor device disclosed in this specification includes a thin film transistor having a gate electrode layer, a gate insulating layer over the gate electrode layer, a source electrode layer and a drain electrode layer over the gate insulating layer, a buffer layer having n-type conductivity over the source and drain electrode layers, and a semiconductor layer over the buffer layer. The semiconductor layer overlapping with the gate electrode layer is partly over and in contact with the gate insulating layer and is provided between the source electrode layer and the drain electrode layer. The semiconductor layer and the buffer layer are an oxide semiconductor layer containing indium, gallium, and zinc. The buffer layer has a higher carrier concentration than the semiconductor layer. The semiconductor layer is electrically connected to the source electrode layer and the drain electrode layer through the buffer layer.

One embodiment of the present invention solves at least one of the above problems.

In the above structure, a second buffer layer having a carrier concentration higher than that of the semiconductor layer and lower than that of the buffer layer may be provided between the semiconductor layer and the buffer layer. The second buffer layer functions as an n⁻ layer.

The oxide semiconductor film (IGZO film) containing In, Ga, and Zn has such a characteristic that the hole mobility increases as the carrier concentration increases. Thus, the carrier concentration and the hole mobility of the oxide semiconductor film containing In, Ga, and Zn have a relationship shown in FIG. 25. It is preferable that, in the present invention, an IGZO film appropriate for a channel of a semiconductor layer have a carrier concentration range (a concentration range 1 for a channel) less than $1\times10^{17}$ atoms/cm³ (more preferably, $1\times10^{11}$ atoms/cm³ or more). On the other hand, when the IGZO film is used as a buffer layer, it is preferable that the IGZO film have a carrier concentration range (a concentration range 2 of a buffer layer) of $1\times10^{18}$ atoms/cm³ or more ($1\times10^{22}$ atoms/cm³ or less). In the case where the IGZO film is used as a semiconductor layer, the carrier concentration thereof is a value obtained at room temperature in the condition where source, drain, and gate voltages are not applied.

If the carrier concentration range of the IGZO film for a channel exceeds the above range, a thin film transistor has a risk of being normally-on. Thus, with use of an IGZO film within the above carrier concentration range as a channel of a semiconductor layer, a more highly reliable thin film transistor can be provided.

In addition, a titanium film is preferably used as a source and drain electrode layers. For example, a stacked layer of a titanium film, an aluminum film, and a titanium film has a low resistance, and a hillock is hardly generated in the aluminum film.

Further, a side surface of the source electrode layer and a side surface of the drain electrode layer opposite to the side surface of the source electrode layer are covered with the buffer layer. Accordingly, a channel length L of the thin film transistor is the distance between a first buffer layer covering the source electrode layer and a second buffer layer covering the drain electrode layer.

One embodiment of the present invention to achieve the above structure is a method for manufacturing a semiconductor device, which includes forming a gate electrode layer over a substrate, forming a gate insulating layer over the gate electrode layer, forming a source electrode layer and a drain electrode layer over the gate insulating layer, forming a buffer layer having n-type conductivity over the source electrode layer and the drain electrode layer, and forming a semiconductor layer over the buffer layer. The semiconductor layer and the buffer layer are formed using an oxide semiconductor layer containing indium, gallium, and zinc. The buffer layer has a higher carrier concentration than the semiconductor layer. The semiconductor layer is electrically connected to the source electrode layer and the drain electrode layer through the buffer layer.

Note that in the above manufacturing method, the semiconductor layer is partly over and in contact with the gate insulating layer overlapping with the gate electrode layer and is provided between the source electrode layer and the drain electrode layer.

The semiconductor layer, the n-type buffer layer, and the source and drain electrode layers may be formed by sputtering. It is preferable that the gate insulating layer and the semiconductor layer be formed in an oxygen atmosphere (or an atmosphere containing oxygen at 90% or more and a rare gas (argon) at 10% or less) and that the n-type buffer layer be formed in a rare gas (argon) atmosphere.

Examples of sputtering include an RF sputtering in which a high-frequency power source is used for a sputtering power source, a DC sputtering, and a pulsed DC sputtering in which a bias is applied in a pulsed manner. An RF sputtering is mainly used in the case of forming an insulating film, and a DC sputtering is mainly used in the case of forming a metal film.

In addition, there is also a multi-source sputtering apparatus in which a plurality of targets of different materials can be set. With the multi-source sputtering apparatus, films of different materials can be formed to be stacked in the same chamber, or a plurality of kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

In addition, as a forming method by sputtering, there are also a reactive sputtering in which a target substance and a sputtering gas component are chemically reacted with each other during deposition to form a thin compound film thereof, and a bias sputtering in which voltage is also applied to a substrate during deposition.

By any of a variety of sputtering methods, the semiconductor layer, the buffer layer having n-type conductivity, and the source and drain electrode layers are formed.

According to the present invention, a thin film transistor having a small amount of photocurrent, low parasitic capacitance, a high on-off ratio, and good dynamic characteristics can be manufactured. Accordingly, a semiconductor device including a thin film transistor having high electrical properties and high reliability can be provided.

BRIEF DESCRIPTION OF THE DRAWINGS

In the accompanying drawings:

FIGS. 18A and 18B are diagrams illustrating a semiconductor device of one embodiment of the present invention;

DETAILED DESCRIPTION OF THE INVENTION

Figure 1A:
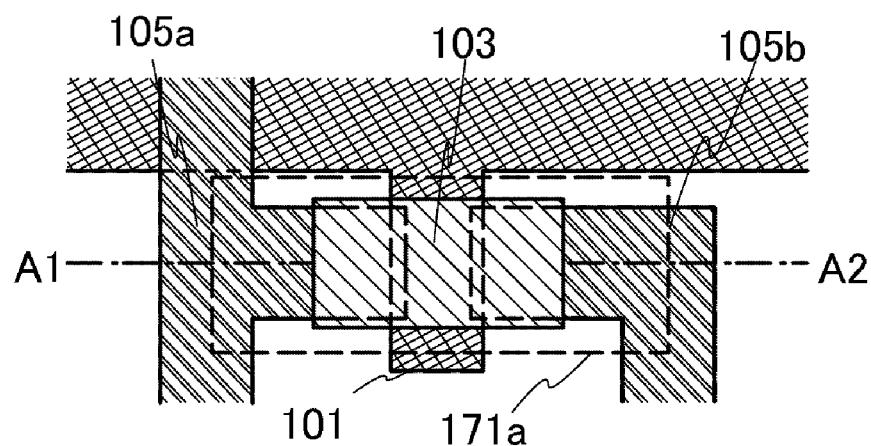
FIGS. 1A and 1B are diagrams illustrating a semiconductor device of one embodiment of the present invention.

Embodiments of the present invention will be described in detail with reference to drawings. Note that the present invention is not limited to the description below, and it is apparent to those skilled in the art that modes and details can be modified in various ways without departing from the spirit and scope of the present invention. Accordingly, the present invention should not be construed as being limited to the description of the embodiments given below. Note that in the structures of the present invention described below, like portions or portions having a similar function are denoted by like reference numerals, and the description thereof is omitted.

Embodiment 1

In this embodiment, a thin film transistor and a manufacturing process thereof will be described with reference to FIGS. 1A and 1B and FIG. 2.

Figure 1B:
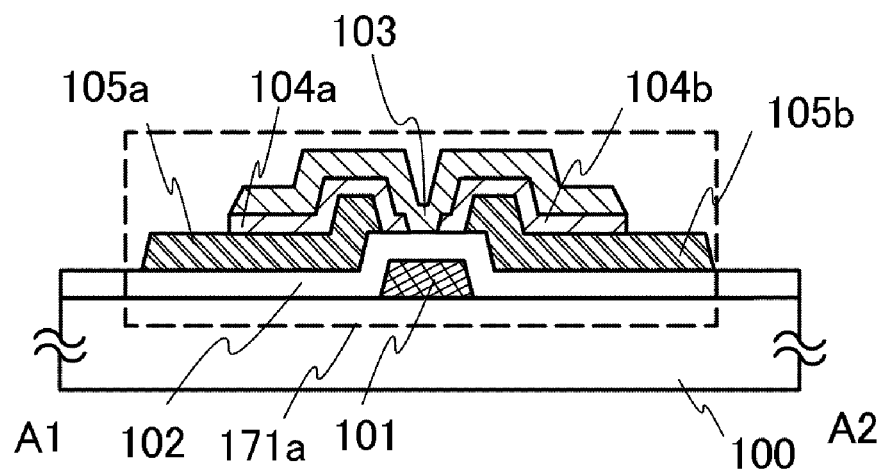
Figure 2:
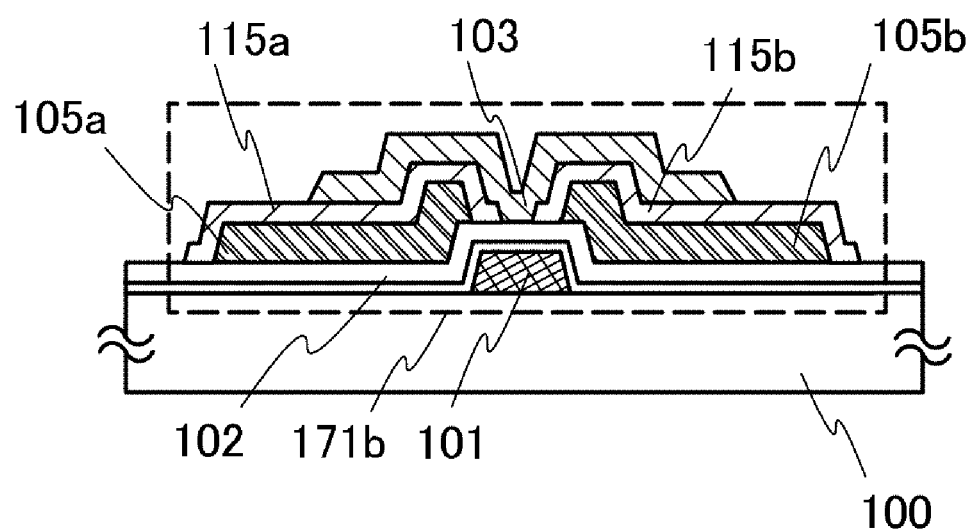
FIG. 2 is a diagram illustrating a semiconductor device of one embodiment of the present invention.

Thin film transistors 171a and 171b of this embodiment, each having a kind of bottom gate structure (also referred to as a bottom contact structure), are illustrated in FIGS. 1A and 1B and FIG. 2. FIG. 1A is a plan view and FIG. 1B is a cross-sectional view taken along line A1-A2 of FIG. 1A.

In FIGS. 1A and 1B, the thin film transistor 171a that includes a gate electrode layer 101, a gate insulating layer 102, a source and drain electrode layers 105a and 105b, n-type buffer layers 104a and 104b, and a semiconductor layer 103 is provided over a substrate 100.

As the semiconductor layer 103, an oxide semiconductor film containing In, Ga, and Zn is used. The buffer layers 104a and 104b having higher carrier concentration than the semiconductor layer 103 are intentionally provided between the source and drain electrode layers 105a and 105b and the semiconductor layer 103 that is an IGZO semiconductor layer, whereby an ohmic contact is formed.

As the buffer layers 104a and 104b, an n-type oxide semiconductor film containing In, Ga, and Zn is used. An impurity element imparting n-type conductivity may be added to the buffer layers 104a and 104b. As an example of the impurity element, it is possible to use, for example, magnesium, aluminum, titanium, iron, tin, calcium, germanium, scandium, yttrium, zirconium, hafnium, boron, thallium, or lead. A buffer layer containing magnesium, aluminum, titanium, or the like has a blocking effect against oxygen, and the oxygen concentration of the semiconductor layer can be kept within the optimal range by heat treatment or the like after film formation.

In the present invention, it is preferable that the semiconductor layer have a carrier concentration lower than $1\times10^{17}$ atoms/cm$^3$ (more preferably, $1\times10^{11}$ atoms/cm$^3$ or higher) and that the buffer layer have a carrier concentration of $1\times10^{18}$ atoms/cm$^3$ or higher ($1\times10^{22}$ atoms/cm$^3$ or lower).

If the carrier concentration range of the IGZO for a channel exceeds the above range, the thin film transistor has a risk of being normally-on. Thus, with use of the IGZO film within the above carrier concentration range as a channel of the semiconductor layer, a highly reliable thin film transistor can be obtained.

In the case where a second buffer layer serving as an n$^+$ layer, which has a carrier concentration lower than that of the buffer layer and higher than that of the semiconductor layer, is provided between the semiconductor layer and the buffer layer, the carrier concentration of the second buffer layer may be set between the carrier concentration of the semiconductor layer and the carrier concentration of the buffer layer.

The buffer layers 104a and 104b serve as an n$^+$ layer and can also be referred to as a source and drain regions.

A method for manufacturing the thin film transistor 171a of FIGS. 1A and 1B is described with reference to FIGS. 3A to 3E.

Figure 3A:
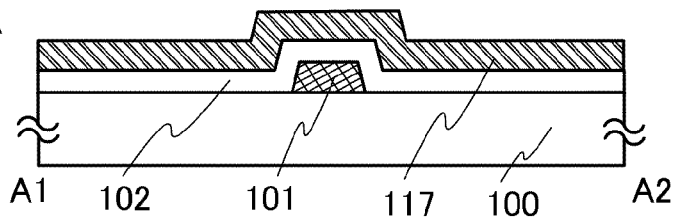
FIGS. 3A to 3E are diagrams illustrating a method for manufacturing a semiconductor device of one embodiment of the present invention.
Figure 3B:
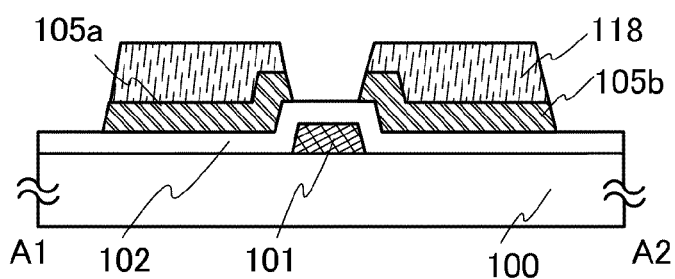

The gate electrode layer 101, the gate insulating layer 102, and a conductive film 117 are formed over the substrate 100 (see FIG. 3A). As the substrate 100, any of the following substrates can be used: non-alkaline glass substrates made of barium borosilicate glass, aluminoborosilicate glass, aluminosilicate glass, or the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film on its surface, may also be used. The substrate 100 may have a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

In addition, an insulating film may be formed as a base film over the substrate 100. The base film may be formed with a single layer or plural layers of a silicon oxide film, a silicon nitride film, a silicon oxynitride film, and/or a silicon nitride oxide film by CVD, sputtering, or the like.

The gate electrode layer 101 is formed of a metal material such as titanium, molybdenum, chromium, tantalum, tungsten, or aluminum, or an alloy material thereof. The gate electrode layer 101 can be formed in such a manner that a conductive film is formed over the substrate 100 by sputtering or vacuum evaporation; a mask is formed over the conductive film by photolithography or ink-jet; and the conductive film is etched using the mask. Alternatively, the gate electrode layer 101 can be formed by discharging a conductive nanopaste of silver, gold, copper, or the like by ink-jet and baking it. Note that, as a barrier metal which increases adhesion of the gate electrode layer 101 and prevents diffusion of a material of the gate electrode layer 101 to the substrate or the base film, a nitride film of the above-mentioned metal material may be provided between the substrate 100 and the gate electrode layer 101. The gate electrode layer 101 may have a single-layer structure or a multi-layer structure. For example, a structure in which a molybdenum film and an aluminum film are stacked in this order, a structure in which a molybdenum film and an alloy film of aluminum and neodymium are stacked in this order, a structure in which a titanium film and an aluminum film are stacked in this order, a structure in which a titanium film, an aluminum film, and a titanium film are stacked in this order, or the like can be formed over the substrate 100.

Note that, since a semiconductor film and a wiring are to be formed over the gate electrode layer 101, it is preferable that the gate electrode layer 101 be processed to have tapered end portions in order to prevent disconnection.

The gate insulating layer 102 can be formed by CVD, sputtering, or the like using a silicon oxide film, a silicon nitride film, a silicon oxynitride film, or a silicon nitride oxide film. The thin film transistor 171b of FIG. 2 shows an example in which the gate insulating layer 102 has a multi-layer structure.

As the gate insulating layer 102, a silicon nitride film or a silicon nitride oxide film, and a silicon oxide film or a silicon oxynitride film may be stacked in this order. Note that the gate insulating layer 102 is not limited to a two-layer structure, and may have a three-layer structure in which a silicon nitride film or a silicon nitride oxide film, a silicon oxide film or a silicon oxynitride film, and a silicon nitride film or a silicon nitride oxide film are stacked in this order over the substrate. Alternatively, the gate insulating layer 102 may have a single-layer structure of a silicon oxide film, a silicon nitride film, a silicon oxynitride film, or a silicon nitride oxide film.

The gate insulating layer 102 is preferably formed under an oxygen atmosphere (or an atmosphere containing oxygen at 90% or more and rare gas (such as argon or helium) at 10% or less).

Alternatively, as the gate insulating layer 102, a silicon nitride film may be formed over the gate electrode layer 101 by plasma CVD, and a silicon oxide film may be formed over the silicon nitride film by sputtering. Further alternatively, a silicon nitride film and a silicon oxide film may be stacked in this order over the gate electrode layer 101 by plasma CVD, and a silicon oxide film may be further stacked over the silicon oxide film by sputtering.

In this specification, a silicon oxynitride film refers to a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. On the other hand, a silicon nitride oxide film refers to a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Alternatively, the gate insulating layer 102 may be formed using one kind of oxide, nitride, oxynitride, or nitride oxide of aluminum, yttrium, or hafnium; or a compound including at least two or more kinds of these compounds.

A halogen element such as chlorine or fluorine may be contained in the gate insulating layer 102. The concentration of the halogen element in the gate insulating layer 102 may be from $1\times10^{15}$ atoms/cm$^3$ to $1\times10^{20}$ atoms/cm$^3$ at the concentration peak.

The conductive film 117 is preferably formed using a single layer or plural layers of aluminum, or an aluminum alloy to which an element improving heat resistance or an element preventing a hillock, such as copper, silicon, titanium, neodymium, scandium, or molybdenum, is added. Alternatively, the conductive film 117 may have a multi-layer structure where a film on the side touching an n-type semiconductor film to be formed later is formed of titanium, tantalum, molybdenum, tungsten, or nitride of any of these elements and an aluminum film or an aluminum alloy film is formed thereover. Further alternatively, the conductive film 117 may have a multi-layer structure where the top and bottom surfaces of aluminum or an aluminum alloy are each covered with titanium, tantalum, molybdenum, tungsten, or nitride thereof. Here, a multi-layer conductive film of a titanium film, an aluminum film, and a titanium film is used as the conductive film 117.

A multi-layer structure of a titanium film, an aluminum film, and a titanium film has a low resistance and a hillock is hardly generated in the aluminum film.

The conductive film 117 is formed by sputtering or vacuum evaporation. Alternatively, the conductive film 117 may be formed by discharging a conductive nanopaste of silver, gold, copper, or the like by screen printing, ink-jet, or the like and baking it.

Next, a mask 118 is formed over the conductive film 117. The conductive film 117 is processed by etching with use of the mask 118, whereby the source and drain electrode layers 105a and 105b are formed (see FIG. 3B).

Then, the mask 118 is removed, and an n-type semiconductor film, which is an oxide semiconductor film containing In, Ga, and Zn and having n-type conductivity, is formed over the source and drain electrode layers 105a and 105b. For example, a mixed film may be formed by sputtering IGZO as a first target and a material having n-type conductivity as a second target at the same time (co-sputtering) to be used as the buffer layer. Here, the top and side surfaces of the source and drain electrode layers 105a and 105b are covered with the n-type semiconductor film, and thus, the n-type semiconductor film can protect the source and drain electrode layers 105a and 105b.

Figure 3C:
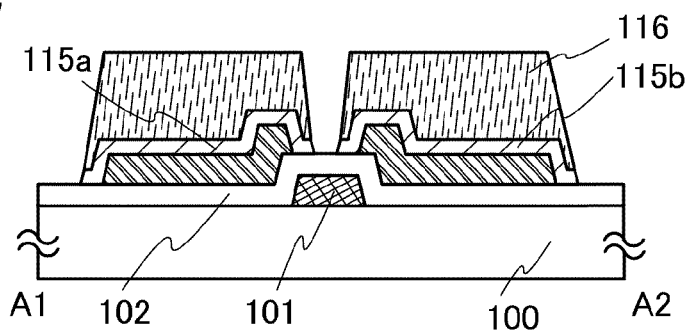

Next, a mask 116 is formed over the n-type semiconductor film, and the n-type semiconductor film is processed by etching with use of the mask 116, whereby n-type semiconductor layers 115a and 115b are formed (see FIG. 3C). Here, the n-type semiconductor layers 115a and 115b are patterned to cover the source and drain electrode layers 105a and 105b to protect them. Note that the shape of the n-type semiconductor layers 115a and 115b is not limited to the patterned shape illustrated in FIG. 3C. At least the side surfaces of the source and drain electrode layers 105a and 105b which are closer to the gate electrode need to be covered with the n-type semiconductor layers; however, the side surfaces of the source and drain electrode layers 105a and 105b far from the gate electrode are not necessarily covered with the n-type semiconductor layers. If the side surfaces of the source and drain electrode layers 105a and 105b which are closer to the gate electrode are not covered with the n-type semiconductor layers, the side surfaces directly touch the IGZO film forming a channel, which may result in the formation of Schottky junction to increase the contact resistance.

The distance between the n-type semiconductor layers 115a and 115b formed by etching the n-type semiconductor film is the channel length of the thin film transistor. If the distance between the n-type semiconductor layers 115a and 115b is fixed and exists above the gate electrode, substantially the same electrical properties can be obtained even when misalignment occurs, which allows the variations in thin film transistors to be reduced. In addition, the distance between the n-type semiconductor layers 115a and 115b can be freely determined depending on the etching conditions. In conventional thin film transistors, the distance between the source electrode layer and the drain electrode layer is the channel length. In that case, since a metal film with high conductivity or a metal film on which hillocks are easily generated is used, a short circuit between the source electrode layer and the drain electrode layer may occur when the distance therebetween is reduced.

Figure 3D:
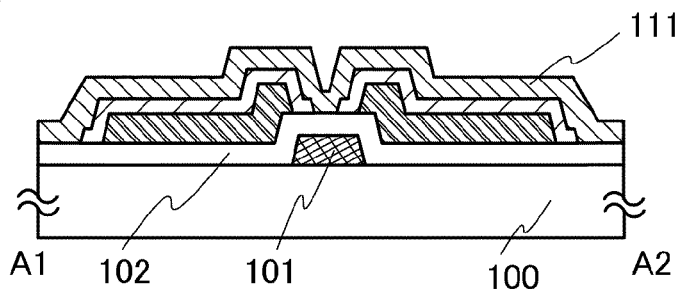

Next, the mask 116 is removed, and a semiconductor film 111 is formed over the n-type semiconductor layers 115a and 115b (see FIG. 3D).

As the semiconductor film 111, an oxide semiconductor film containing In, Ga, and Zn is formed. For example, as the semiconductor film 111, an oxide semiconductor film containing In, Ga, and Zn may be formed to a thickness of 50 nm by sputtering. The semiconductor film 111 is preferably formed under an oxygen atmosphere (or an atmosphere containing oxygen at 90% or more and rare gas (such as argon or helium) at 10% or less).

The oxide semiconductor films such as the semiconductor film 111 and the n-type semiconductor film can be formed by a vapor phase method such as pulsed laser deposition (PLD) or electron beam evaporation, as well as by sputtering. Among the vapor phase methods, PLD is suitable in terms of easy control of the composition of materials, and sputtering is suitable in terms of mass productivity as described above.

The semiconductor film 111 can be specifically formed under the following conditions: an oxide semiconductor target containing In, Ga, and Zn, which has a diameter of 8 inches, is used, the distance between the substrate and the target is 170 mm, the pressure is 0.4 Pa, direct current (DC) power source is 0.5 kW, and the formation is performed under an argon or oxygen atmosphere. In addition, a pulsed direct current (DC) power source is preferably used so that dust can be reduced and even distribution of thickness can be achieved.

Figure 3E:
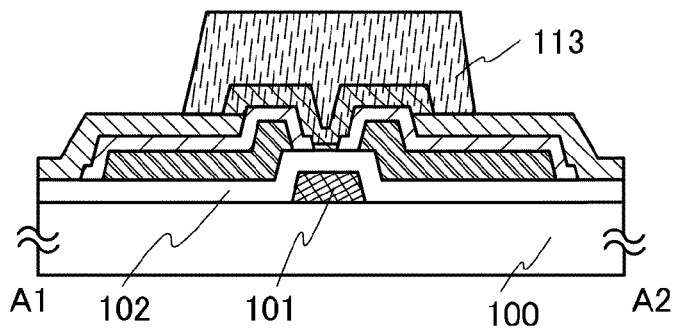

Next, a mask 113 for processing the semiconductor film 111 is formed (see FIG. 3E). By etching the semiconductor film 111 using the mask 113, the semiconductor layer 103 can be formed.

The buffer layers 104a and 104b are also formed by etching using the same mask 113. Accordingly, as illustrated in FIGS. 1A and 1B, the edges of the semiconductor layer 103 are substantially aligned with the edges of the buffer layers 104a and 104b. Note that the IGZO semiconductor films such as the semiconductor film 111 and the n-type semiconductor layers 115a and 115b can be etched using organic acid such as citric acid or oxalic acid as an etchant. For example, the semiconductor film 111 with a thickness of 50 nm can be processed by etching in 150 seconds with use of ITO07N (manufactured by KANTO CHEMICAL CO., INC.).

The semiconductor layer 103 is etched to have a tapered edge, whereby disconnection of a wiring due to a step shape can be prevented.

After that, the mask 113 is removed. Through the above process, the thin film transistor 171a can be formed. Note that the channel length L of the thin film transistor 171a corresponds to the distance between the n-type semiconductor layers 115a and 115b (the distance between the buffer layers 104a and 104b). Therefore, the distance between the source and drain electrode layers 105a and 105b can be increased without changing the distance between the n-type semiconductor layers 115a and 115b. An increase in the distance between the source and drain electrode layers 105a and 105b can prevent generation of hillocks and a short circuit between the source electrode layer and the drain electrode layer. Moreover, an increase in the distance between the source and drain electrode layers 105a and 105b can reduce the area of the source and drain electrode layers 105a and 105b which overlaps with the gate electrode, and thus reduce the parasitic capacitance with the gate electrode. Accordingly, a thin film transistor with good dynamic characteristics, for example, with high frequency characteristics (referred to as F characteristics) can be obtained.

Further, an insulating film may be formed as a protective film over the thin film transistor 171a. The protective film can be formed in a manner similar to the gate insulating layer. Note that the protective film is provided to prevent entry of impurities floating in the air, such as an organic substance, a metal substance, or moisture, and is preferably a dense film. For example, a silicon oxide film and a silicon nitride film may be stacked over the thin film transistor 171a to be used as the protective film.

Further, it is preferable that heat treatment be performed on the oxide semiconductor films such as the semiconductor layer 103 and the buffer layers 104a and 104b. Heat treatment may be performed in any step after the film formation step, and it can be performed immediately after the oxide semiconductor films are formed, after the protective film is formed, or the like. Further, such heat treatment may also serve as another heat treatment. The heating temperature may be from 300° C. to 400° C., and preferably, 350° C. The heat treatment may be performed plural times so that heat treatment of the semiconductor layer 103 and heat treatment of the buffer layers 104a and 104b are performed in different steps.

A manufacturing process of the thin film transistor 171b illustrated in FIG. 2 will be described with reference to FIGS. 3A to 3E. Only a part of the manufacturing process of the thin film transistor 171b illustrated in FIG. 2 is different from the manufacturing process of the thin film transistor 171a of FIG. 1B; thus, the different part will be described below.

FIG. 2 is different from FIG. 1B in that the gate insulating layer 102 has a two-layer structure and the edges of the buffer layers are not aligned with the edges of the semiconductor layer.

In the etching with use of the mask 113 illustrated in FIG. 3E, only the semiconductor layer 103 is selectively etched so that the n-type semiconductor layers 115a and 115b remain, whereby the thin film transistor 171b of FIG. 2 can be obtained. In FIG. 2, the n-type semiconductor layers 115a and 115b serve as buffer layers. In the case where an interlayer insulating film is further formed over the thin film transistor 171b and a wiring is formed over the interlayer insulating film, even if the n-type semiconductor layers 115a and 115b remain at the bottom of contact holes, a good electrical connection between the wiring and the source and drain electrode layers can be achieved.

The thin film transistor described in this embodiment has a structure in which the gate electrode layer, the gate insulating layer, the source and drain electrode layers, the buffer layer (the oxide semiconductor layer containing In, Ga, and Zn and having n-type conductivity), and the semiconductor layer (the oxide semiconductor layer containing In, Ga, and Zn) are stacked. By using the buffer layer having a high carrier concentration, which is the oxide semiconductor layer containing In, Ga, and Zn and having n-type conductivity, the parasitic capacitance can be reduced while the thickness of the semiconductor layer is kept small. Note that the parasitic capacitance is sufficiently suppressed even when the buffer layer has a small thickness, because the thickness of the buffer layer is sufficient with respect to that of the gate insulating layer.

According to this embodiment, a thin film transistor with small photoelectric current, small parasitic capacitance, and a high on-off ratio can be obtained, so that a thin film transistor with good dynamic characteristics can be manufactured. Thus, a semiconductor device including a thin film transistor with high electrical properties and high reliability can be provided.

Embodiment 2

In this embodiment, an example of a thin film transistor having a multi-gate structure, which is one embodiment of the present invention will be described. Accordingly, except the gate electrode layer, the thin film transistor can be formed in a manner similar to Embodiment 1, and repetitive description of the same portions or portions having functions similar to those in Embodiment 1 and manufacturing steps thereof will be omitted.

In this embodiment, a thin film transistor included in a semiconductor device will be described with reference to FIGS. 4A and 4B and FIGS. 5A and 5B.

Figure 4A:
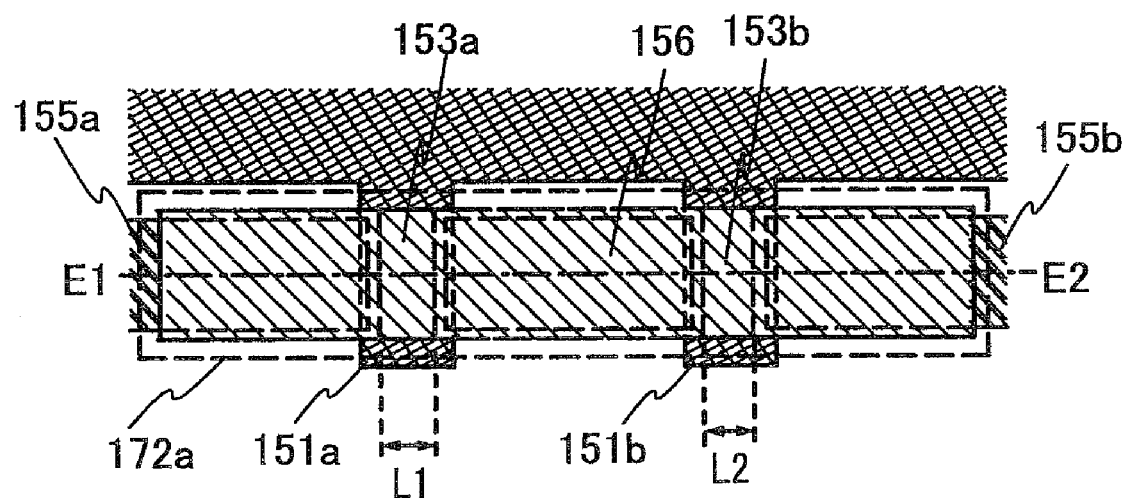
FIGS. 4A and 4B are diagrams illustrating a semiconductor device of one embodiment of the present invention.
Figure 4B:
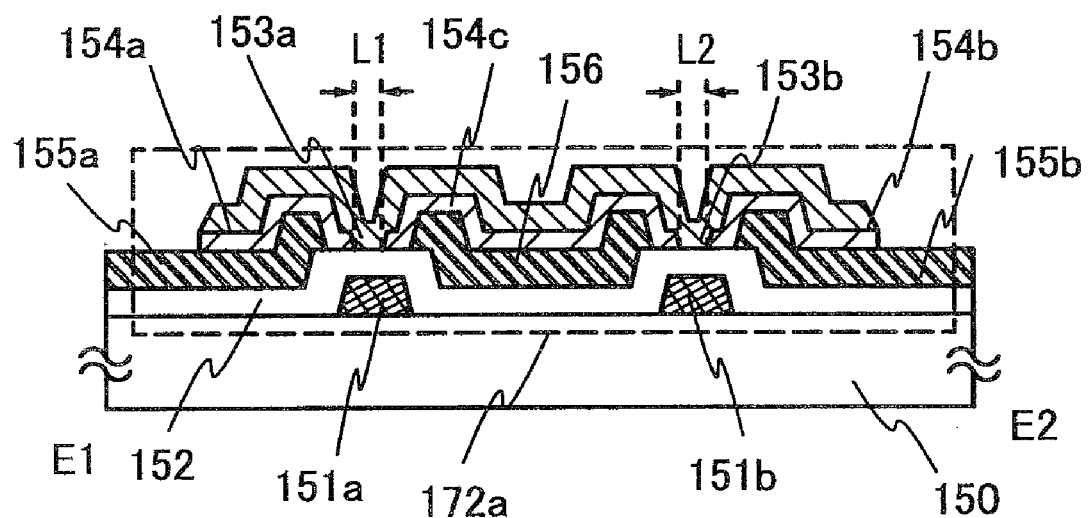

FIG. 4A is a plan view illustrating a thin film transistor 172a and FIG. 4B is a cross-sectional view of the thin film transistor 172a taken along line E1-E2 of FIG. 4A.

As illustrated in FIGS. 4A and 4B, the thin film transistor 172a having a multi-gate structure, which includes gate electrode layers 151a and 151b, a gate insulating layer 152, a source and drain electrode layers 155a and 155b, buffer layers 154a, 154b, and 154c, and channel formation regions 153a and 153b of a semiconductor layer, is formed over a substrate 150. Note that in the thin film transistor 172a having a multi-gate structure, a first channel length L1 corresponds to the distance between the buffer layers 154a and 154c, and a second channel length L2 corresponds to the distance between the buffer layers 154b and 154c.

The channel formation regions 153a and 153b of the semiconductor layer are oxide semiconductor layers containing In, Ga, and Zn, and the buffer layers 154a, 154b, and 154c are n-type oxide semiconductor layers containing In, Ga, and Zn. The buffer layers 154a and 154b serving as a source and drain regions ($n^+$ layers) have a higher carrier concentration than the channel formation regions 153a and 153b of the semiconductor layer.

The channel formation region 153a of the semiconductor layer is electrically connected to the channel formation region 153b of the semiconductor layer. In addition, the channel formation region 153a of the semiconductor layer is electrically connected to the source or drain electrode layer 155a with the buffer layer 154a interposed therebetween, and the channel formation region 153b of the semiconductor layer is electrically connected to the source or drain electrode layer 155b with the buffer layer 154b interposed therebetween.

Figure 5A:
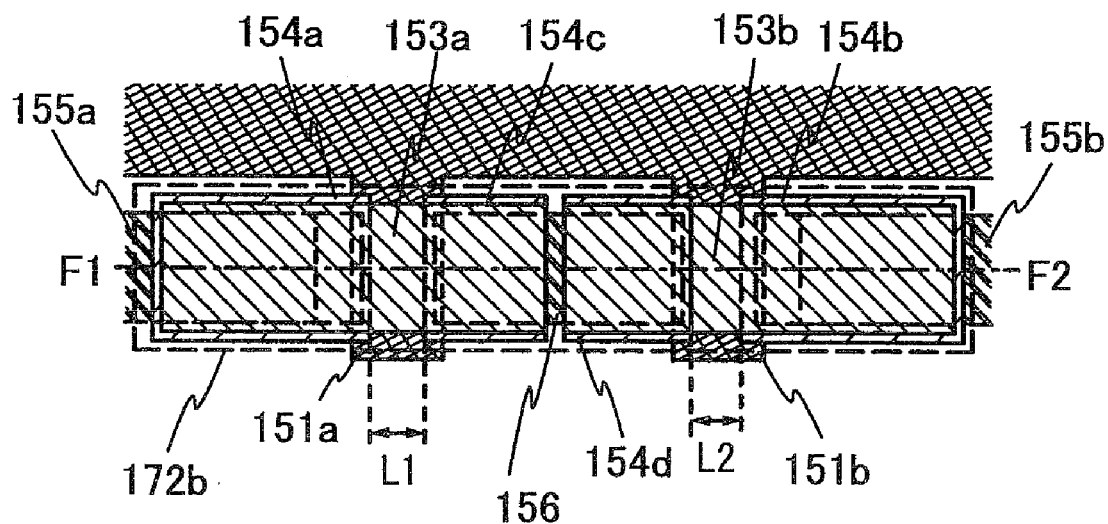
FIGS. 5A and 5B are diagrams illustrating a semiconductor device of one embodiment of the present invention.
Figure 5B:
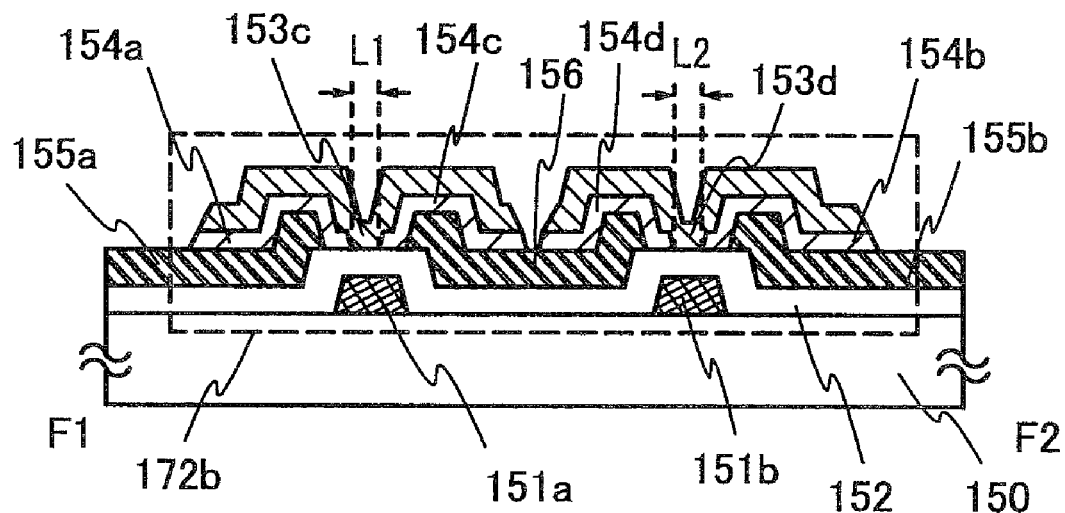

FIGS. 5A and 5B illustrate a thin film transistor 172b having another multi-gate structure. FIG. 5A is a plan view of the thin film transistor 172b and FIG. 5B is a cross-sectional view thereof taken along line F1-F2 of FIG. 5A. In the thin film transistor 172b of FIGS. 5A and 5B, a semiconductor layer is divided into plural parts. A wiring layer 156 which is formed in the same step as the source and drain electrode layers 155a and 155b is provided, and semiconductor layers 153c and 153d are electrically connected to each other through the wiring layer 156 with buffer layers 154c and 154d interposed therebetween.

Note that in the thin film transistor 172b having a multi-gate structure, a first channel length L1 corresponds to the distance between the buffer layers 154a and 154c, and a second channel length L2 corresponds to the distance between the buffer layers 154b and 154d.

As described above, in the thin film transistor having a multi-gate structure of one embodiment of the present invention, a semiconductor layer may be provided continuously over the gate electrode layers, or a plurality of semiconductor layers may be provided to be electrically connected to each other with the buffer layer, the wiring layer, or the like interposed therebetween.

The thin film transistor having a multi-gate structure of one embodiment of the present invention has small off current, and a semiconductor device including such a thin film transistor can have good electrical properties and high reliability.

In this embodiment, examples of a double-gate structure including two gate electrode layers are described as a multi-gate structure, but one embodiment of the present invention can also be applied to a triple-gate structure or the like which has more gate electrode layers than the double gate structure.

This embodiment can be implemented in appropriate combination with the other embodiments.

Embodiment 3

In this embodiment, an example of a display device which is one example of a semiconductor device of one embodiment of the present invention will be described. In the display device, at least a part of a driver circuit and a thin film transistor to be disposed in a pixel portion are formed over one substrate.

The thin film transistor to be disposed in the pixel portion is formed according to Embodiment 1 or 2. Further, the thin film transistor described in Embodiment 1 or 2 is an n-channel TFT, and thus a part of a driver circuit that can include an n-channel TFT among driver circuits is formed over the same substrate as the thin film transistor of the pixel portion.

Figure 6A:
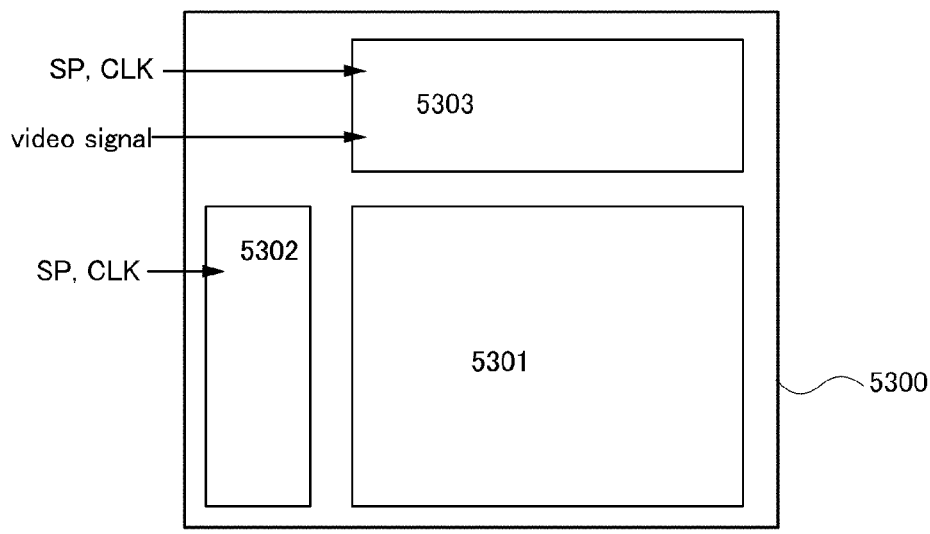
FIGS. 6A and 6B are block diagrams of a semiconductor device.

FIG. 6A is an example of a block diagram of an active matrix liquid crystal display device which is an example of a semiconductor device of one embodiment of the present invention. The display device illustrated in FIG. 6A includes, over a substrate 5300, a pixel portion 5301 including a plurality of pixels each provided with a display element; a scan line driver circuit 5302 for selecting a pixel; and a signal line driver circuit 5303 for controlling a video signal input to the selected pixel.

In addition, the thin film transistor described in any one of Embodiments 1 and 2 is an n-channel TFT, and a signal line driver circuit including the n-channel TFT will be described with reference to FIG. 7.

Figure 7:
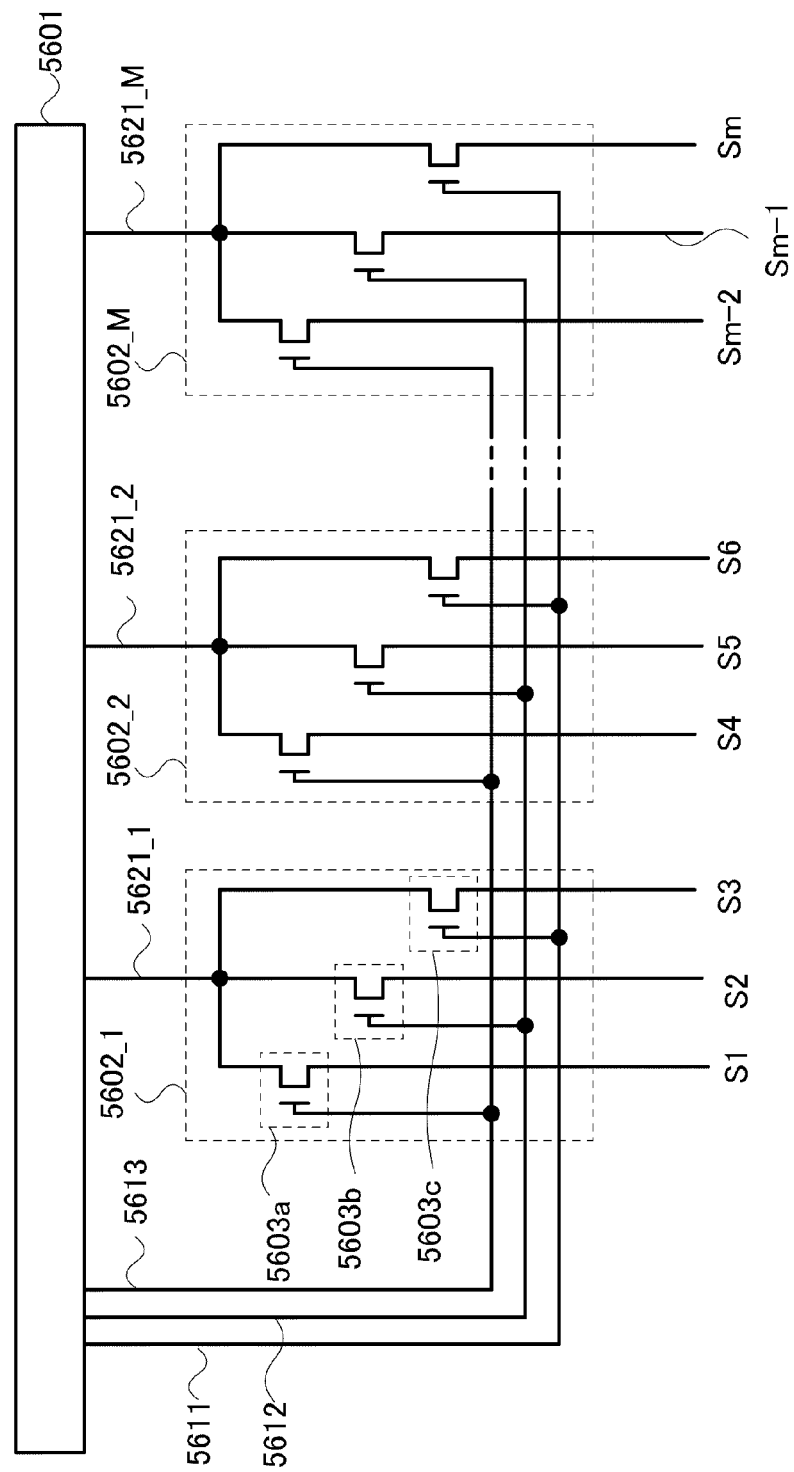
FIG. 7 is a diagram illustrating a configuration of a signal line driver circuit.

The signal line driver circuit illustrated in FIG. 7 includes a driver IC 5601, switch groups 5602-1 to 5602-M, a first wiring 5611, a second wiring 5612, a third wiring 5613, and wirings 5621-1 to 5621-M. Each of the switch groups 5602-1 to 5602-M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621-1 to 5621-M. Each of the switch groups 5602-1 to 5602-M is connected to the first wiring 5611, the second wiring 5612, and the third wiring 5613, and the switch groups 5602-1 to 5602-M are connected to the wirings 5621-1 to 5621-M, respectively. Each of the wirings 5621-1 to 5621-M is connected to three signal lines via the first thin film transistor 5603a, the second thin film transistor 5603b, and the third thin film transistor 5603c. For example, the wiring 5621-J of the J-th column (one of the wirings 5621-1 to 5621-M) is connected to a signal line Sj−1, a signal line Sj, and a signal line Sj+1 via the first thin film transistor 5603a, the second thin film transistor 5603b, and the third thin film transistor 5603c which are included in the switch group 5602-J.

A signal is input to each of the first wiring 5611, the second wiring 5612, and the third wiring 5613.

Note that the driver IC 5601 is preferably formed over a single crystal substrate. Further, the switch groups 5602-1 to 5602-M are preferably formed over the same substrate as the pixel portion. Therefore, the driver IC 5601 is preferably connected to the switch groups 5602-1 to 5602-M through an FPC or the like.

Figure 8:
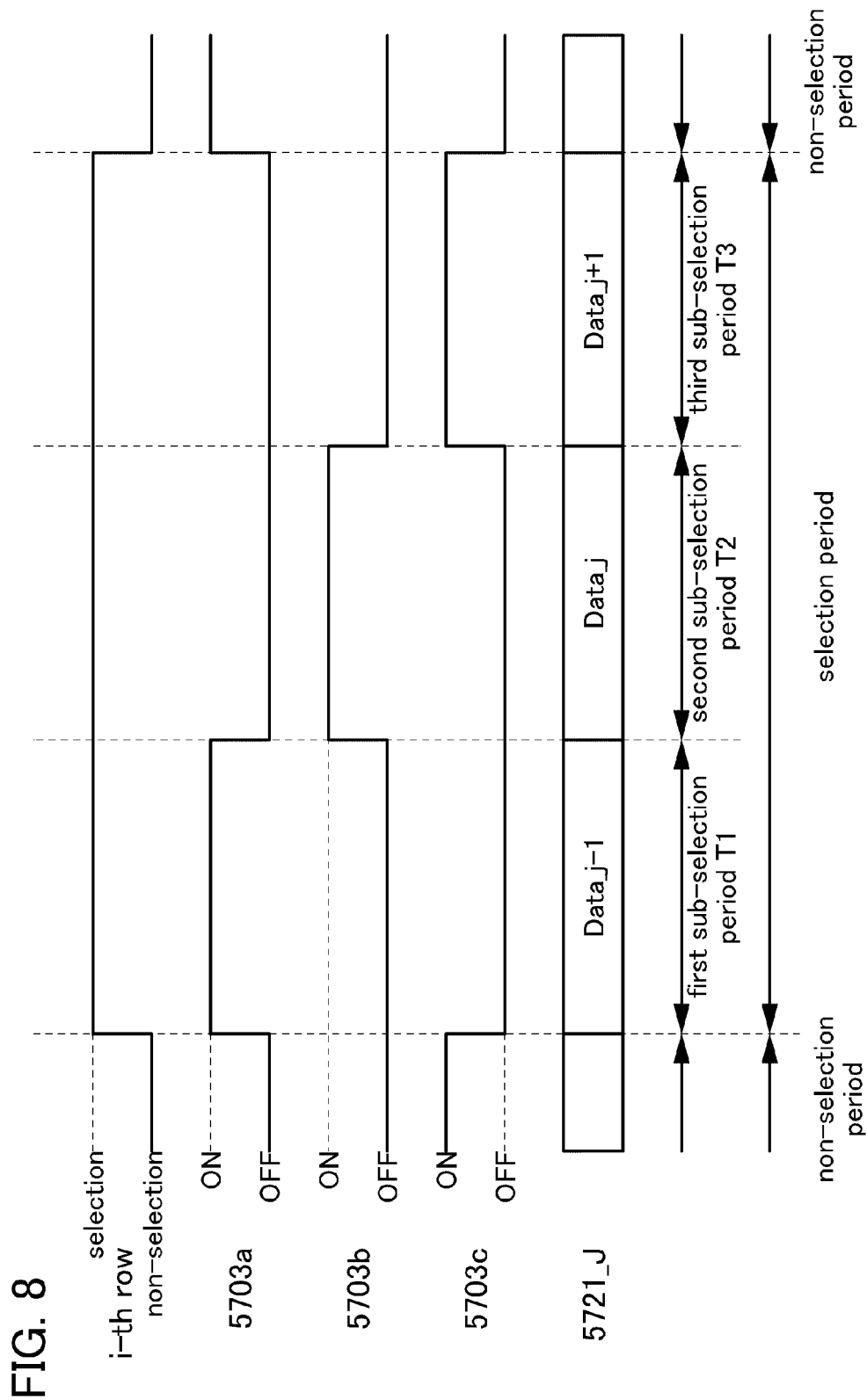
FIG. 8 is a timing chart illustrating operation of a signal line driver circuit.

Next, operation of the signal line driver circuit illustrated in FIG. 7 will be described with reference to a timing chart of FIG. 8. The timing chart of FIG. 8 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 7 operates in a manner similar to that of FIG. 8 even when a scan line of another row is selected.

Note that the timing chart of FIG. 8 illustrates a case where the wiring 5621-J of the J-th column is connected to the signal line Sj−1, the signal line Sj, and the signal line Sj+1 via the first thin film transistor 5603a, the second thin film transistor 5603b, and the third thin film transistor 5603c.

The timing chart of FIG. 8 shows the timing at which the scan line Gi of the i-th row is selected, timing 5703a at which the first thin film transistor 5603a is turned on/off, timing 5703b at which the second thin film transistor 5603b is turned on/off, timing 5703c at which the third thin film transistor 5603c is turned on/off, and a signal 5721-J input to the wiring 5621-J of the J-th column.

In the first sub-selection period T1, the second sub-selection period T2, and the third sub-selection period T3, different video signals are input to the wirings 5621-1 to 5621-M. For example, a video signal input to the wiring 5621-J in the first sub-selection period T1 is input to the signal line Sj−1, a video signal input to the wiring 5621-J in the second sub-selection period T2 is input to the signal line Sj, and a video signal input to the wiring 5621-J in the third sub-selection period T3 is input to the signal line Sj+1. The video signals input to the wiring 5621-J in the first sub-selection period T1, the second sub-selection period T2, and the third sub-selection period T3 are denoted by Data-j−1, Data-j, and Data-j+1, respectively.

As illustrated in FIG. 8, in the first sub-selection period T1, the first thin film transistor 5603a is turned on, and the second thin film transistor 5603b and the third thin film transistor 5603c are turned off. At this time, Data-j−1 input to the wiring 5621-J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data-j input to the wiring 5621-J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data-j+1 input to the wiring 5621-J is input to the signal line Sj+1 via the third thin film transistor 5603c.

As described above, in the signal line driver circuit of FIG. 7, by dividing one gate selection period into three, video signals can be input to three signal lines from one wiring 5621 in one gate selection period. Therefore, in the signal line driver circuit of FIG. 7, the number of connections between the substrate provided with the driver IC 5601 and the substrate provided with the pixel portion can be approximately ⅓ of the number of signal lines. When the number of connections is reduced to approximately ⅓ of the number of the signal lines, the reliability, yield, and the like of the signal line driver circuit of FIG. 7 can be improved.

Note that there are no particular limitations on the arrangement, number, driving method, and the like of the thin film transistors, as long as one gate selection period is divided into a plurality of sub-selection periods and video signals are input to a plurality of signal lines from one wiring in the respective sub-selection periods as illustrated in FIG. 7.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 9:
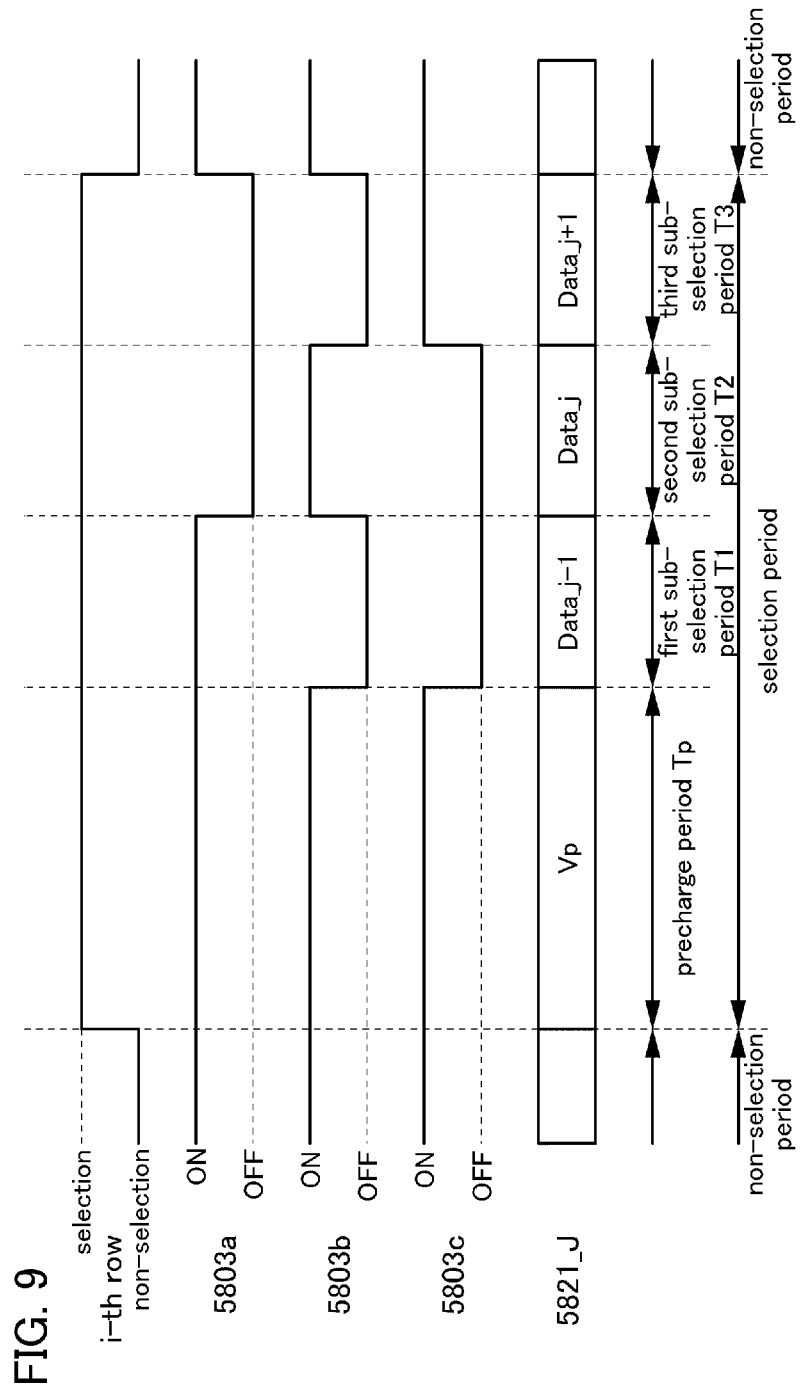
FIG. 9 is a timing chart illustrating operation of a signal line driver circuit.

As another example, one selection period may be divided into a precharge period Tp, the first sub-selection period T1, the second sub-selection period T2, and the third sub-selection period T3 as illustrated in a timing chart of FIG. 9. The timing chart of FIG. 9 illustrates the timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821-J input to the wiring 5621-J of the J-th column. As illustrated in FIG. 9, the first thin film transistor 5603a, the second thin film transistor 5603b, and the third thin film transistor 5603c are tuned on in the precharge period Tp. At this time, precharge voltage Vp input to the wiring 5621-J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data-j−1 input to the wiring 5621-J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data-j input to the wiring 5621-J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data-j+1 input to the wiring 5621-J is input to the signal line Sj+1 via the third thin film transistor 5603c.

As described above, in the signal line driver circuit of FIG. 7 to which the timing chart of FIG. 9 is applied, the video signal can be written to the pixel at high speed because the signal line can be precharged by providing a precharge selection period before a sub-selection period. Note that portions of FIG. 9 which are similar to those of FIG. 8 are denoted by common reference numerals and detailed description of like portions and portions having a similar function is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer which can supply a large current is used.

One mode of a shift register used for a part of the scan line driver circuit will be described with reference to FIG. 10 and FIG. 11.

Figure 10:
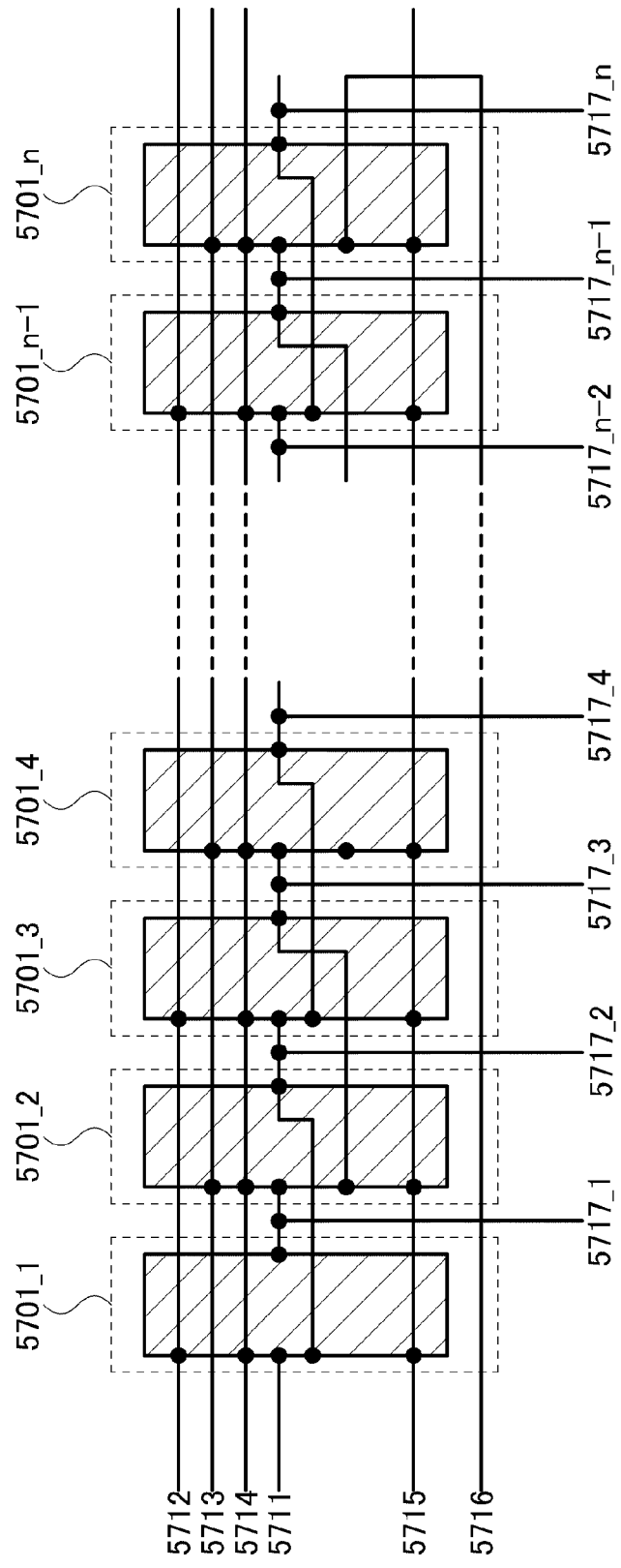
FIG. 10 is a diagram illustrating a configuration of a shift register.

FIG. 10 illustrates a circuit configuration of the shift register. The shift register illustrated in FIG. 10 includes a plurality of flip-flops 5701-i (one of flip-flops 5701-1 to 5701-n). The shift register operates with the input of a first clock signal, a second clock signal, a start pulse signal, and a reset signal.

The connection relationship of the shift register of FIG. 10 will be described. In the i-th stage flip-flop 5701-i (one of the flip-flops 5701-1 to 5701-n) in the shift register of FIG. 10, a first wiring 5501 illustrated in FIG. 11 is connected to a seventh wiring 5717-i−1; a second wiring 5502 illustrated in FIG. 11 is connected to a seventh wiring 5717-i+1; a third wiring 5503 illustrated in FIG. 11 is connected to a seventh wiring 5717-i; and a sixth wiring 5506 illustrated in FIG. 11 is connected to a fifth wiring 5715.

Figure 11:
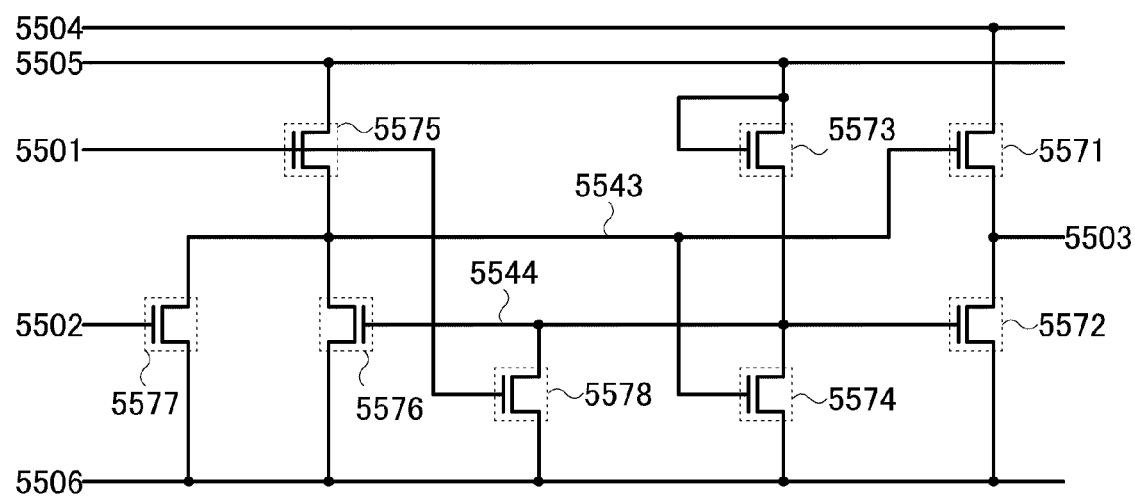
FIG. 11 is a diagram illustrating a connection of a flip-flop illustrated in FIG. 10.

Further, a fourth wiring 5504 illustrated in FIG. 11 is connected to a second wiring 5712 in flip-flops of odd-numbered stages, and is connected to a third wiring 5713 in flip-flops of even-numbered stages. A fifth wiring 5505 illustrated in FIG. 11 is connected to a fourth wiring 5714.

Note that the first wiring 5501 of the first stage flip-flop 5701-1 illustrated in FIG. 11 is connected to a first wiring 5711. Moreover, the second wiring 5502 of the n-th stage flip-flop 5701-n illustrated in FIG. 11 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 11 illustrates details of the flip-flop illustrated in FIG. 10. A flip-flop illustrated in FIG. 11 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 10 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505 and a second electrode of the third thin film transistor is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 1 or 2. Since the n-channel TFT described in Embodiment 1 or 2 has a high mobility, the driving frequency of a driver circuit can be increased. In addition, in the n-channel TFT described in Embodiment 1 or 2, since parasitic capacitance is reduced by the buffer layer that is an n-type oxide semiconductor layer containing indium, gallium, and zinc, high frequency characteristics (referred to as F characteristics) can be obtained. For example, a scan line driver circuit using the n-channel TFT described in Embodiment 1 or 2 can operate at high speed, and thus a frame frequency can be increased and insertion of black images can be realized.

In addition, when the channel width of the transistor in the scan line driver circuit is increased or a plurality of scan line driver circuits are provided, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, an increase in frame frequency can be realized.

Figure 6B:
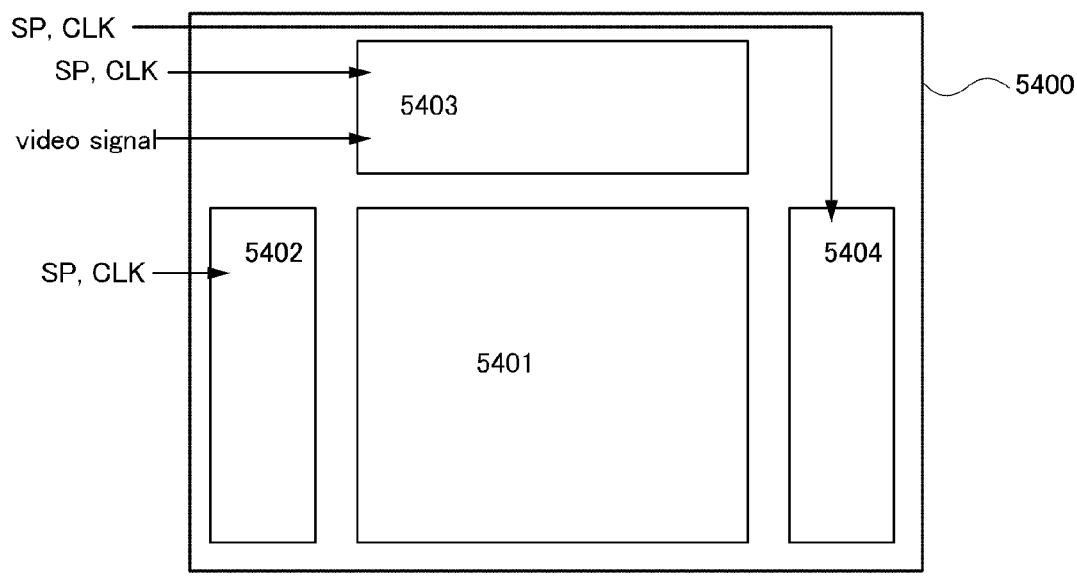

Further, when an active matrix light-emitting display device which is an example of a semiconductor device of one embodiment of the present invention is manufactured, a plurality of thin film transistors are arranged in at least one pixel, and thus a plurality of scan line driver circuits are preferably arranged. FIG. 6B is an example of a block diagram of an active matrix light-emitting display device.

The light-emitting display device illustrated in FIG. 6B includes, over a substrate 5400, a pixel portion 5401 having a plurality of pixels each provided with a display element, a first scan line driver circuit 5402 and a second scan line driver circuit 5404 for selecting a pixel, and a signal line driver circuit 5403 for controlling input of a video signal to the selected pixel.

When the video signal input to a pixel of the light-emitting display device illustrated in FIG. 6B is a digital signal, a pixel emits light or does not emit light by switching a transistor on/off. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. Further, a time ratio grayscale method refers to a driving method by which a period during which a pixel emits light is controlled so that grayscale is displayed.

Since the response time of a light-emitting element is higher than that of a liquid crystal element or the like, the light-emitting element is more suitable for a time ratio grayscale method than the liquid crystal element. Specifically, in the case of displaying with a time gray scale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale is displayed.

In the light-emitting display device illustrated in FIG. 6B, in a case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

Also in the light-emitting display device, a part of a driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 1 or 2.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the first particles and the second particles have different colors (which may be colorless).

In this way, an electrophoretic display is a display that utilizes a so-called dielectrophoretic effect by which a substance having a high dielectric constant moves to a high-electric field region. An electrophoretic display device does not need to use a polarizer or a counter substrate, which is required in a liquid crystal display device, and both the thickness and weight of the electrophoretic display device can be a half of those of a liquid crystal display device.

A solution in which the above microcapsules are dispersed in a solvent is referred to as electronic ink. This electronic ink can be printed on a surface of glass, plastic, cloth, paper, or the like. Furthermore, with use of a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors described in Embodiment 1 or 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above process, a highly reliable display device as a semiconductor device can be manufactured.

This embodiment can be implemented in appropriate combination with the structures described in Embodiment 1 or 2.

Embodiment 4

A thin film transistor of one embodiment of the present invention is manufactured, and a semiconductor device having a display function (also referred to as a display device) can be manufactured using the thin film transistor for a pixel portion and further for a driver circuit. Further, when part or whole of a driver circuit using a thin film transistor of one embodiment of the present invention is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Further, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

In this embodiment, a liquid crystal display device will be described as an example of a semiconductor device of one embodiment of the present invention.

Figure 12A:
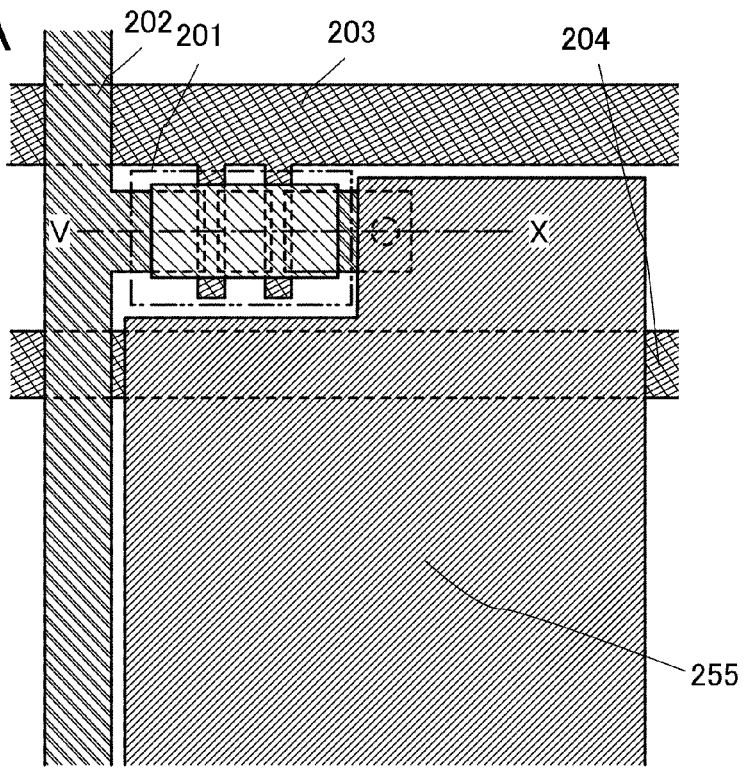
FIGS. 12A and 12B are diagrams illustrating a semiconductor device of one embodiment of the present invention.
Figure 12B:
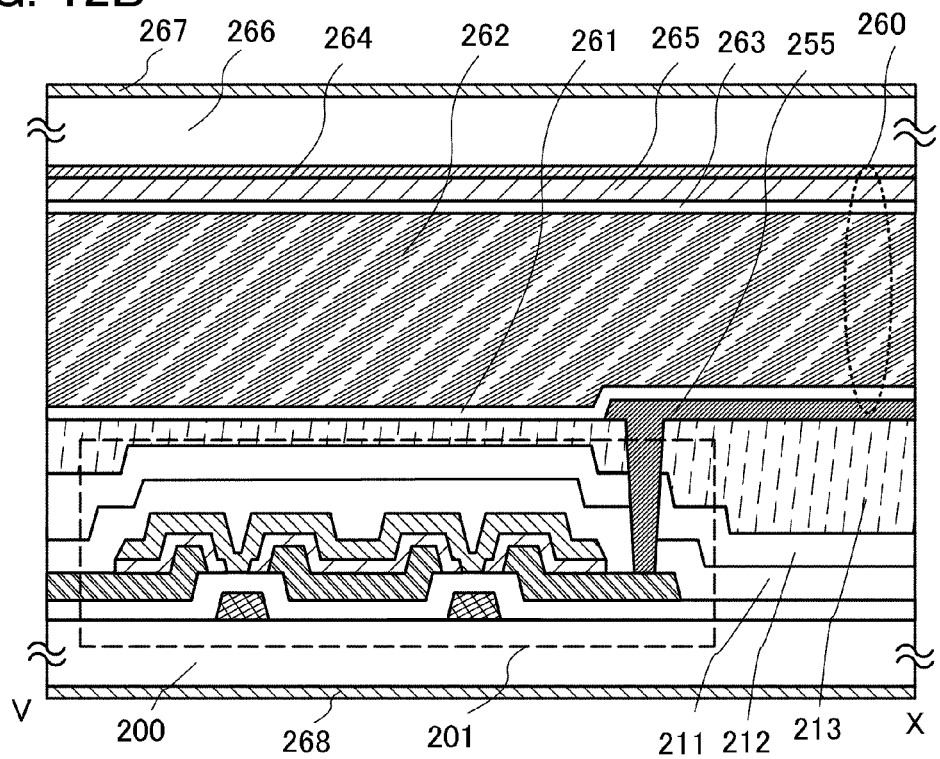

FIGS. 12A and 12B illustrate an active matrix liquid crystal display device to which the present invention is applied. FIG. 12A is a plan view of the liquid crystal display device. FIG. 12B is a cross-sectional view taken along line V-X of FIG. 12A. A thin film transistor 201 used in the semiconductor device can be manufactured in a manner similar to the thin film transistor described in Embodiment 2 and is a highly reliable thin film transistor including an IGZO semiconductor layer and an IGZO semiconductor layer having n-type conductivity. Alternatively, the thin film transistor described in Embodiment 1 can be used as the thin film transistor 201 of this embodiment.

The liquid crystal display device of this embodiment illustrated in FIG. 12A includes a source wiring layer 202, a thin film transistor 201 with a multi-gate structure, a gate wiring layer 203, and a capacitor wiring layer 204.

Further, in FIG. 12B, the liquid crystal display device of this embodiment includes a liquid crystal display element 260 in which a substrate 200 and a substrate 266 face each other with a liquid crystal layer 262 interposed therebetween. The substrate 200 is provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268. The substrate 266 is provided with an insulating layer 263 serving as an alignment film, an electrode layer 265 used for a display element, a coloring layer 264 serving as a color filter, and a polarizing plate 267.

Alternatively, liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 262 in order to improve the temperature range. The liquid crystal composition which includes liquid crystal showing a blue phase and a chiral agent has a small response time of 10 µs to 100 µs, has optical isotropy, which makes the alignment process unneeded, and has a small viewing angle dependence.

Although FIGS. 12A and 12B illustrate an example of a transmissive liquid crystal display device, an embodiment of the present invention can also be applied to a reflective liquid crystal display device and a transflective liquid crystal display device.

FIGS. 12A and 12B illustrate an example of the liquid crystal display device in which the polarizing plate 267 is provided on the outer surface of the substrate 266 (on the viewer side) and the coloring layer 264 and the electrode layer 265 used for a display element are provided on the inner surface of the substrate 266 in that order; however, the polarizing plate 267 may be provided on the inner surface of the substrate 266. The stacked structure of the polarizing plate and the coloring layer is not limited to that illustrated in FIG. 12B and may be set as appropriate depending on materials of the polarizing plate and the coloring layer or conditions of manufacturing steps. Further, a light-blocking film serving as a black matrix may be provided.

In this embodiment, in order to reduce the surface roughness of the thin film transistor and to improve the reliability of the thin film transistor, the thin film transistor obtained by Embodiment 2 is covered with the insulating layers (the insulating layer 211, the insulating layer 212, and the insulating layer 213) serving as a protective film or a planarizing insulating film. Note that the protective film is provided to prevent entry of impurities floating in the air, such as an organic substance, a metal substance, or moisture, and is preferably a dense film. The protective film may be formed by CVD, sputtering, or the like to be a single-layer film or a multi-layer film of a silicon oxide film, a silicon nitride film, a silicon oxynitride film, and/or a silicon nitride oxide film. Alternatively, as the protective film, a silicon oxide film may be formed by plasma CVD using a process gas containing an organosilane gas and oxygen.

As examples of organosilane, the following compounds can be given: tetraethoxysilane (TEOS) (chemical formula:

Si(OC$_2$H$_5$)$_4$), tetramethylsilane (TMS) (chemical formula: Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), and trisdimethylaminosilane (SiH(N(CH$_3$)$_2$)$_3$).

As a first layer of the protective film, the insulating layer 211 is formed. The insulating layer 211 has an effect of preventing a hillock of an aluminum film. Here, as the insulating layer 211, a silicon oxide film is formed by plasma CVD. For a process gas for forming the silicon oxide film, TEOS and O$_2$ are used. The flow rates of TEOS and O$_2$ are 15 sccm and 750 sccm, respectively. The substrate temperature in the formation step is 300° C.

As a second layer of the protective film, the insulating layer 212 is formed. Here, as the insulating layer 212, a silicon nitride film is formed by plasma CVD. For a process gas for forming the silicon nitride film, SiH$_4$, N$_2$, NH$_3$, and H$_2$ are used. The use of the silicon nitride film as one layer of the protective film can prevent mobile ions such as sodium ions from entering a semiconductor region, thereby suppressing variations in electrical properties of the TFT.

After the protective film is formed, the IGZO semiconductor layer may be annealed (at 300° C. to 400° C.).

The insulating layer 213 is formed as the planarizing insulating film. For the insulating layer 213, an organic material having heat resistance, such as polyimide, acrylic, polyimide, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include as a substituent at least one of fluorine, an alkyl group, and an aryl group, as well as hydrogen. Note that the insulating layer 213 may be formed by stacking a plurality of insulating films formed of these materials.

Note that a siloxane-based resin is a resin formed from a siloxane material as a starting material and having the bond of Si—O—Si. The siloxane-based resin may include as a substituent at least one of fluorine, an alkyl group, and aromatic hydrocarbon, as well as hydrogen.

The insulating layer 213 can be formed, depending on the material, by CVD, sputtering, SOG, spin coating, dipping, spray coating, droplet discharging (e.g., ink-jet, screen printing, or offset printing), doctor knife, roll coater, curtain coater, knife coater, or the like. In the case where the insulating layer 213 is formed using a material solution, the IGZO semiconductor layer may be annealed (300° C. to 400° C.) at the same time of a baking step. The baking step of the insulating layer 213 also serves as the annealing step of the IGZO semiconductor layer, whereby a semiconductor device can be manufactured efficiently.

The electrode layers 255 and 265 each serving as a pixel electrode layer can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the electrode layers 255 and 265. The pixel electrode made of the conductive composition preferably has a sheet resistance of 10000 ohms per square or less and a transmittance of 70% or more at a wavelength of 550 nm. Further, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

Through the above process, a highly reliable liquid crystal display device as a semiconductor device can be manufactured.

This embodiment can be implemented in appropriate combination with the structures described in any of Embodiments 1 to 3.

Embodiment 5

In this embodiment, an example of electronic paper will be described as a semiconductor device of one embodiment of the present invention.

Figure 13:
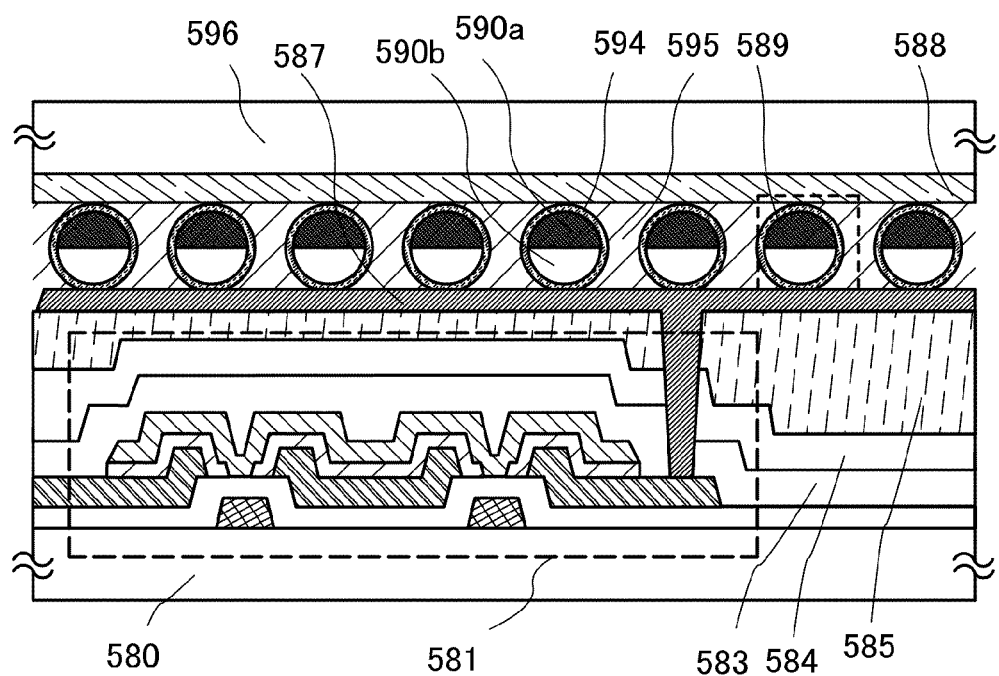
FIG. 13 is a diagram illustrating a semiconductor device of one embodiment of the present invention.

FIG. 13 illustrates active matrix electronic paper as an example of a semiconductor device to which an embodiment of the present invention is applied. A thin film transistor 581 used for the semiconductor device can be manufactured in a manner similar to the thin film transistor described in Embodiment 2 and is a highly reliable thin film transistor including an IGZO semiconductor layer and an IGZO semiconductor layer having n-type conductivity. The thin film transistor described in Embodiment 1 can also be used as the thin film transistor 581 of this embodiment.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

The thin film transistor 581 is a kind of inverted staggered thin film transistor (also referred to as a bottom contact transistor) with a multi-gate structure, and a source electrode layer or a drain electrode layer is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 13).

Further, instead of the twisting ball, an electrophoretic element can also be used. A microcapsule having a diameter of about 10 μm to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, highly reliable electronic paper as a semiconductor device can be manufactured.

This embodiment can be implemented in appropriate combination with the structures described in any of Embodiments 1 to 3.

Embodiment 6

In this embodiment, an example of a light-emitting display device will be described as a semiconductor device of one embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 14A:
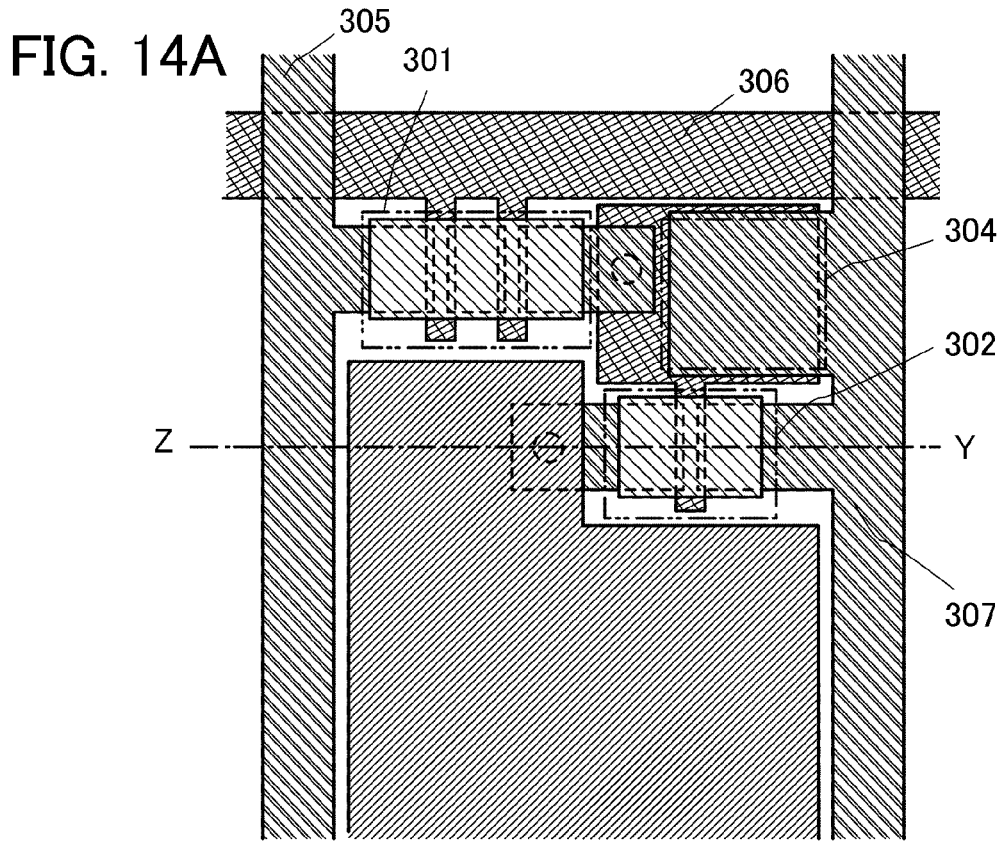
FIGS. 14A and 14B are diagrams illustrating a semiconductor device of one embodiment of the present invention.
Figure 14B:
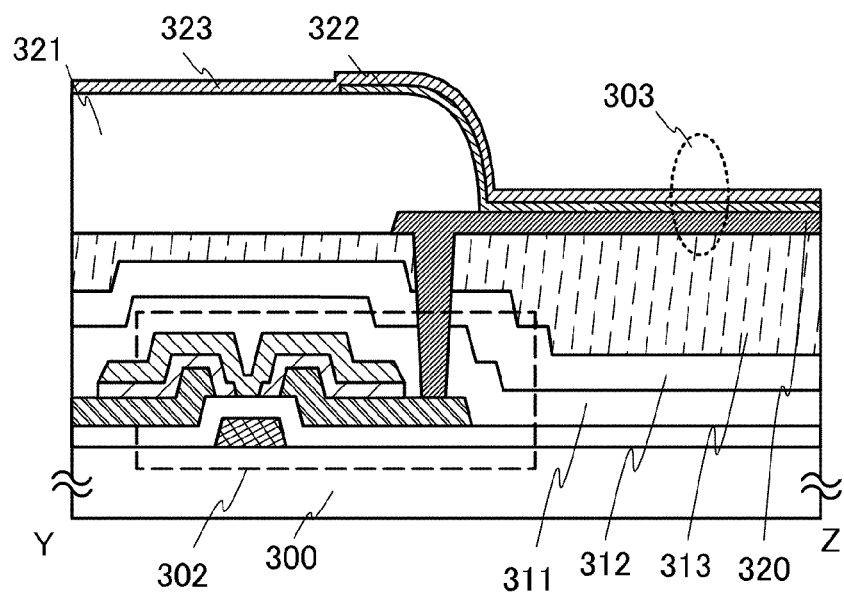
Figure 15:
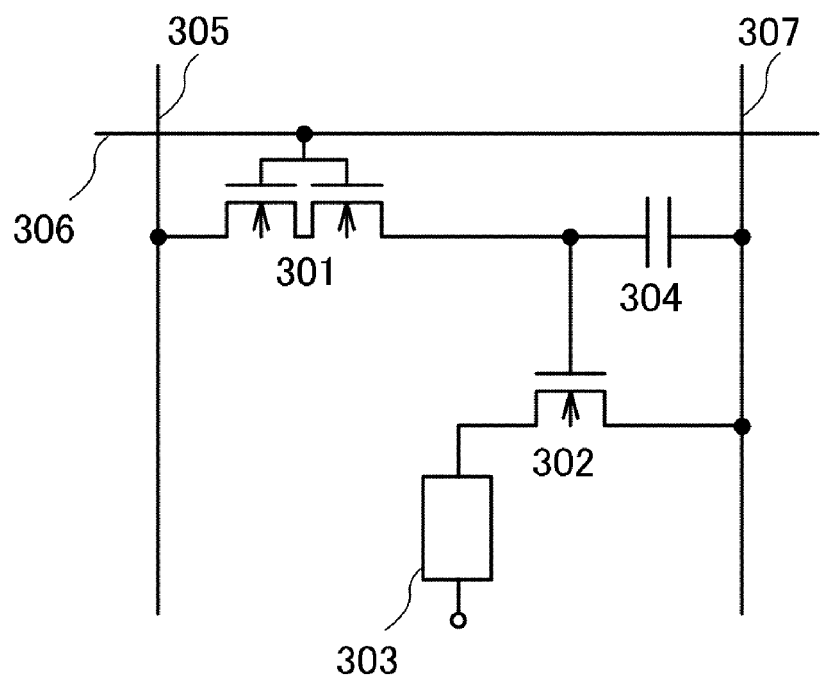
FIG. 15 is a diagram illustrating a semiconductor device of one embodiment of the present invention.

FIGS. 14A and 14B illustrate an active matrix light-emitting display device as an example of a semiconductor device to which the present invention is applied. FIG. 14A is a plan view of the light-emitting display device, and FIG. 14B is a cross-sectional view taken along line Y-Z of FIG. 14A. FIG. 15 shows an equivalent circuit of the light-emitting display device illustrated in FIGS. 14A and 14B.

Thin film transistors 301 and 302 used for a semiconductor device can be manufactured in a manner similar to any of the thin film transistors described in Embodiments 1 and 2, which are highly reliable thin film transistors each including an IGZO semiconductor layer and an IGZO semiconductor layer having n-type conductivity.

The light-emitting display device of this embodiment illustrated in FIG. 14A and FIG. 15 includes a thin film transistor 301 with a multi-gate structure, a thin film transistor 302, a light-emitting element 303, a capacitor element 304, a source wiring layer 305, a gate wiring layer 306, and a power supply line 307. The thin film transistors 301 and 302 are n-channel thin film transistors.

In FIG. 14B, the light-emitting display device of this embodiment includes the thin film transistor 302; an insulating layer 311; an insulating layer 312; an insulating layer 313; a partition wall 321; and a first electrode layer 320, an electroluminescent layer 322, and a second electrode layer 323 which are used for the light-emitting element 303.

The insulating layer 313 is preferably made of an organic resin such as acrylic, polyimide, or polyamide, or siloxane.

Since the thin film transistor 302 in the pixel is of an n-type in this embodiment, a cathode is preferably used as the first electrode layer 320 which is a pixel electrode layer. Specifically, for the cathode, a material with a low work function, such as Ca, Al, CaF, MgAg, or AlLi can be used.

The partition wall 321 is made of an organic resin film, an inorganic insulating film, or organic polysiloxane. It is particularly preferable that the partition wall 321 be formed of a photosensitive material to have an opening over the first electrode layer 320 so that a sidewall of the opening is formed as an inclined surface with continuous curvature.

The electroluminescent layer 322 may be formed using a single layer or a plurality of layers stacked.

The second electrode layer 323 using an anode is formed to cover the electroluminescent layer 322. The second electrode layer 323 can be made of a light-transmitting conductive film using any of the light-transmitting conductive materials listed in Embodiment 4 for the pixel electrode layer. The second electrode layer 323 may also be formed of a titanium nitride film or a titanium film instead of the above-described light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent oxygen, hydrogen, moisture, carbon dioxide, or the like from entering into the light-emitting element 303. As the protective film, a silicon nitride film, a silicon nitride oxide film, a DLC film, or the like can be formed.

Further, in a practical case, it is preferable that a display device completed to the state illustrated in FIG. 14B be packaged (sealed) with a protective film (such as a bonding film or an ultraviolet curable resin film) or a cover material with high air-tightness and little degasification so that the display device is not exposed to the outside air.

Next, structures of the light-emitting element will be described with reference to FIGS. 16A to 16C. A cross-sectional structure of a pixel will be described by taking an n-channel driving TFT as an example. Driving TFTs 7001, 7011, and 7021 used for semiconductor devices illustrated in FIGS. 16A to 16C can be manufactured in a manner similar to the thin film transistor described in Embodiment 1, which are highly reliable thin film transistors each including an IGZO semiconductor layer and an IGZO semiconductor layer having n-type conductivity. Alternatively, the thin film transistor described in Embodiment 2 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure illustrated in FIGS. 16A to 16C can be applied to a light-emitting element having any of these emission structures.

Figure 16A:
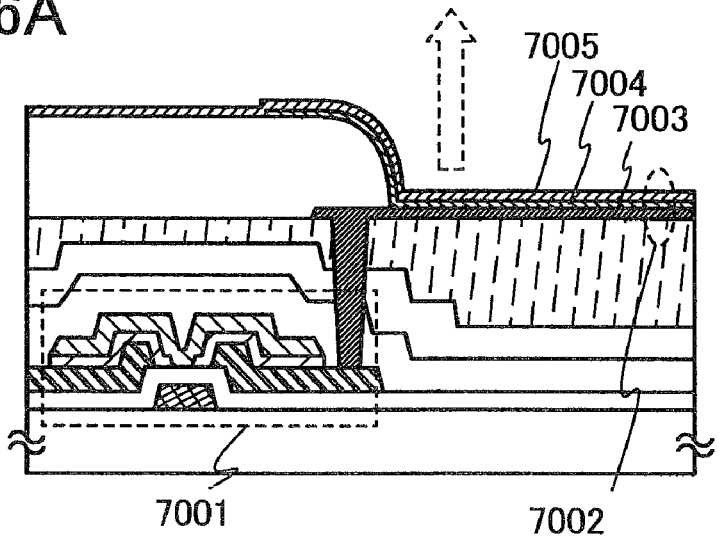
FIGS. 16A to 16C are diagrams illustrating a semiconductor device of one embodiment of the present invention.

A light-emitting element having a top emission structure will be described with reference to FIG. 16A FIG. 16A is a cross-sectional view of a pixel in the case where the driving TFT 7001 is of an n-type and light is emitted from a light-emitting element 7002 to an anode 7005 side. In FIG. 16A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 16A, light is emitted from the light-emitting element 7002 to the anode 7005 side as indicated by an arrow.

Next, a light-emitting element having a bottom emission structure will be described with reference to FIG. 16B. FIG. 16B is a cross-sectional view of a pixel in the case where the driving TFT 7011 is of an n-type and light is emitted from a light-emitting element 7012 to a cathode 7013 side. In FIG. 16B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used, like in the case of FIG. 16A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 16A, the light-emitting layer 7014 may be formed using either a single layer or a plurality of layers stacked. The anode 7015 is not required to transmit light, but can be made of a light-transmitting conductive material like in the case of FIG. 16A. As the light-blocking film 7016, a metal that reflects light can be used for example; however, it is not limited to a metal film. For example, a resin to which black pigments are added can also be used.

The light-emitting element 7012 corresponds to a region where the cathode 7013 and the anode 7015 sandwich the light-emitting layer 7014. In the case of the pixel illustrated in FIG. 16B, light is emitted from the light-emitting element 7012 to the cathode 7013 side as indicated by an arrow.

Next, a light-emitting element having a dual emission structure will be described with reference to FIG. 16C. In FIG. 16C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 16A, the cathode 7023 can be made of a variety of conductive materials as long as they have a low work function. Note that the cathode 7023 is formed to have a thickness that can transmit light. For example, a film of Al having a thickness of 20 nm can be used as the cathode 7023. Like in FIG. 16A, the light-emitting layer 7024 may be formed using either a single layer or a plurality of layers stacked. The anode 7025 can be made of a light-transmitting conductive material like in the case of FIG. 16A.

The light-emitting element 7022 corresponds to a region where the cathode 7023, the light-emitting layer 7024, and the anode 7025 overlap with one another. In the case of the pixel illustrated in FIG. 16C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 16B:
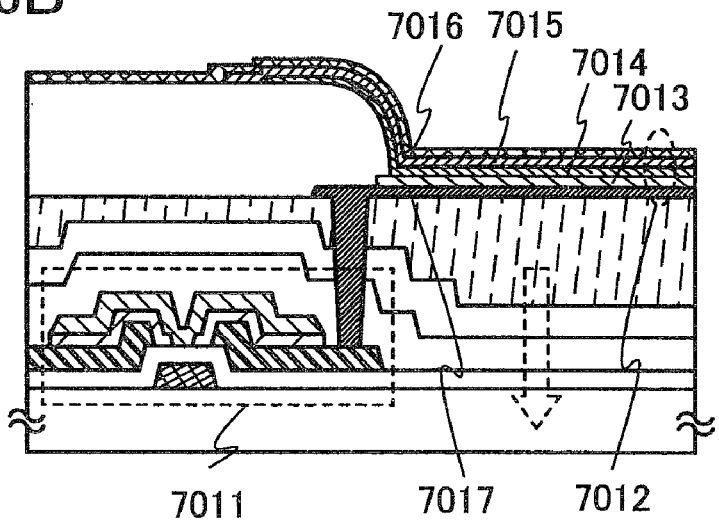
Figure 16C:
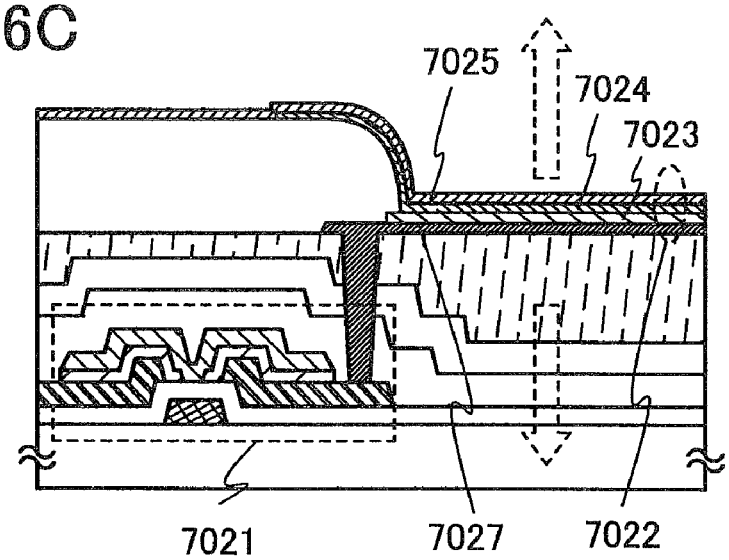

The structure of the semiconductor device described in this embodiment is not limited to those illustrated in FIGS. 16A to 16C and can be modified in various ways based on the spirit of techniques of the present invention.

Through the above process, highly reliable light-emitting display device as a semiconductor device can be manufactured.

This embodiment can be implemented in appropriate combination with the structures described in any of Embodiments 1 to 3.

Embodiment 7

Next, a structure of a display panel which is one embodiment of the semiconductor device of the present invention will be described below. In this embodiment, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, will be described.

Figure 17A:
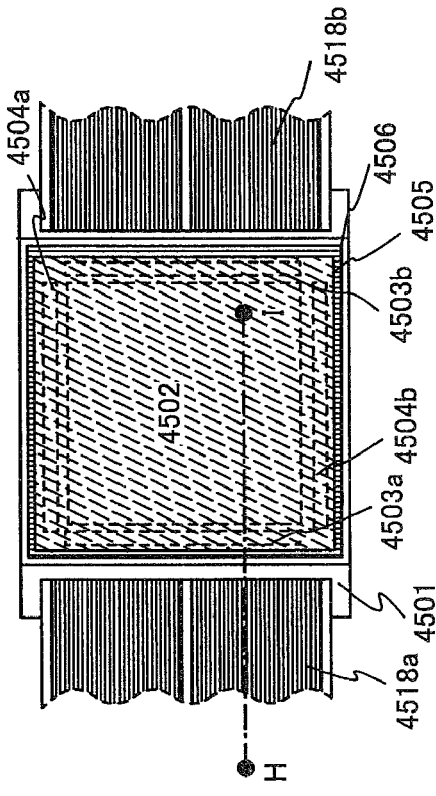
FIGS. 17A and 17B are diagrams illustrating a semiconductor device of one embodiment of the present invention.
Figure 17B:
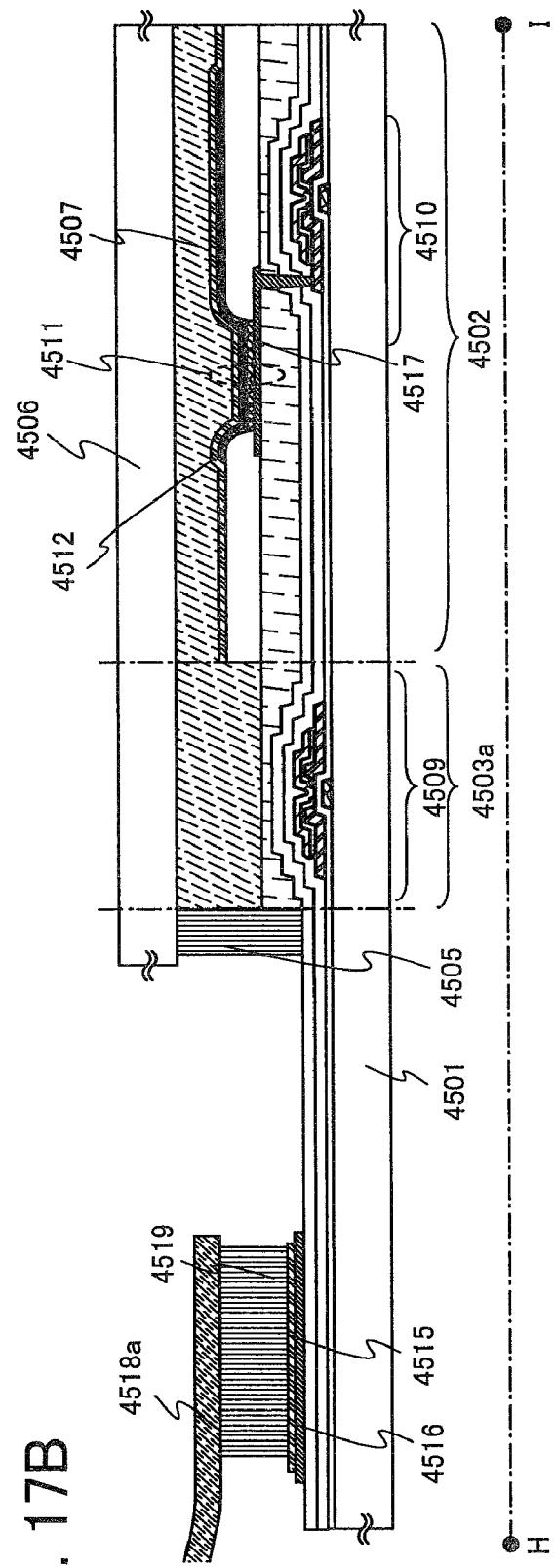

Next, the appearance and a cross section of a light-emitting display panel, which is one embodiment of the semiconductor device of the present invention, will be described with reference to FIGS. 17A and 17B. FIG. 17A is a top view of a panel in which a highly reliable thin film transistor including an IGZO semiconductor layer and an IGZO semiconductor layer having n-type conductivity and a light-emitting element are sealed between a first substrate and a second substrate with a sealant. FIG. 17B is a cross-sectional view taken along line H-I of FIG. 17A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion

4502, the signal line driver circuits 4503a and 4503b, and the scanning line driver circuits 4504a and 4504b are sealed together with a filler 4507, by the first substrate 4501, the sealant 4505, and the second substrate 4506.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 17B.

Each of the thin film transistors 4509 and 4510 corresponds to a thin film transistor having an IGZO semiconductor layer and an IGZO semiconductor layer having n-type conductivity, and any of the thin film transistors described in Embodiment 1 or 2 can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503a and 4503b, the scanning line driver circuits 4504a and 4504b, or the pixel portion 4502 from FPCs 4518a and 4518b.

In this embodiment, a connection terminal 4515 is formed using the same conductive film as that of the second electrode layer 4512, and a wiring 4516 is formed using the same conductive film as that of the first electrode layer 4517 included in the light-emitting element 4511.

The connection terminal 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 17A and 17B.

Next, the appearance and a cross section of a liquid crystal display panel, which is one embodiment of the semiconductor device of the present invention, will be described with reference to FIGS. 18A and 18B. FIGS. 18A1 and 18A2 are top views of a panel in which highly reliable thin film transistors 4010 and 4011 each including an IGZO semiconductor layer and an IGZO semiconductor layer having n-type conductivity, and a liquid crystal element 4013 are sealed between a first substrate 4001 and a second substrate 4006 with a sealant 4005. FIG. 18B is a cross-sectional view taken along line M-N of FIGS. 18A1 and 18A2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and COG, wire bonding, TAB, or the like can be used. FIG. 18A1 illustrates an example of mounting the signal line driver circuit 4003 by COG, and FIG. 18A2 illustrates an example of mounting the signal line driver circuit 4003 by TAB.

The pixel portion 4002 and the scanning line driver circuit 4004 provided over the first substrate 4001 each include a plurality of thin film transistors. FIG. 18B illustrates the thin film transistor 4010 included in the pixel portion 4002 and the thin film transistor 4011 included in the scanning line driver circuit 4004.

Each of the thin film transistors 4010 and 4011 corresponds to a thin film transistor including an IGZO semiconductor layer and an IGZO semiconductor layer having n-type conductivity, and any of the thin film transistors described in Embodiment 1 or 2 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used.

Further, a variety of signals and a potential are supplied to the signal line driver circuit 4003 that is formed separately, the scanning line driver circuit 4004, or the pixel portion 4002 from an FPC 4018.

In this embodiment, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Note that FIGS. 18A and 18B illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 19:
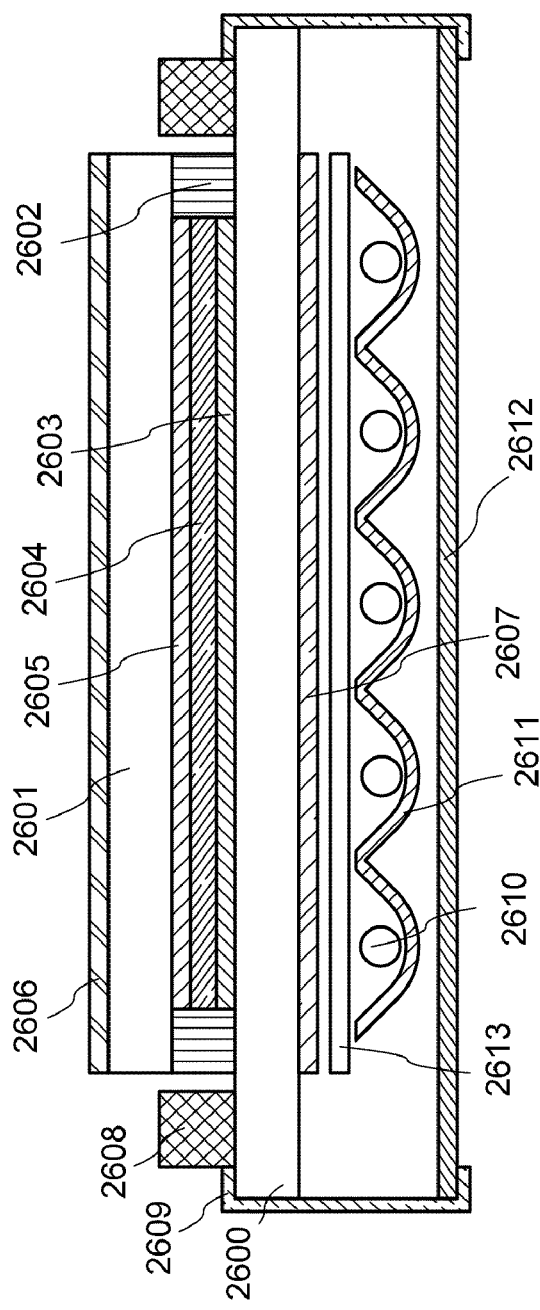
FIG. 19 is a diagram illustrating a semiconductor device of one embodiment of the present invention.

FIG. 19 illustrates an example of a liquid crystal display module which is formed as a semiconductor device by using a TFT substrate 2600 manufactured by the present invention.

FIG. 19 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, highly reliable display panel as a semiconductor device can be manufactured.

This embodiment can be implemented in appropriate combination with the structures described in any of Embodiments 1 to 6.

Embodiment 8

A semiconductor device of one embodiment of the present invention can be applied to electronic paper. Electronic paper can be used for electronic appliances of a variety of fields as long as they can display data. For example, electronic paper can be applied to an e-book reader (electronic book), a poster, a transportation advertisement in a vehicle such as a train, displays of various cards such as a credit card, and the like. Examples of the electronic appliances are illustrated in FIGS. 20A and 20B and FIG. 21.

Figure 20A:
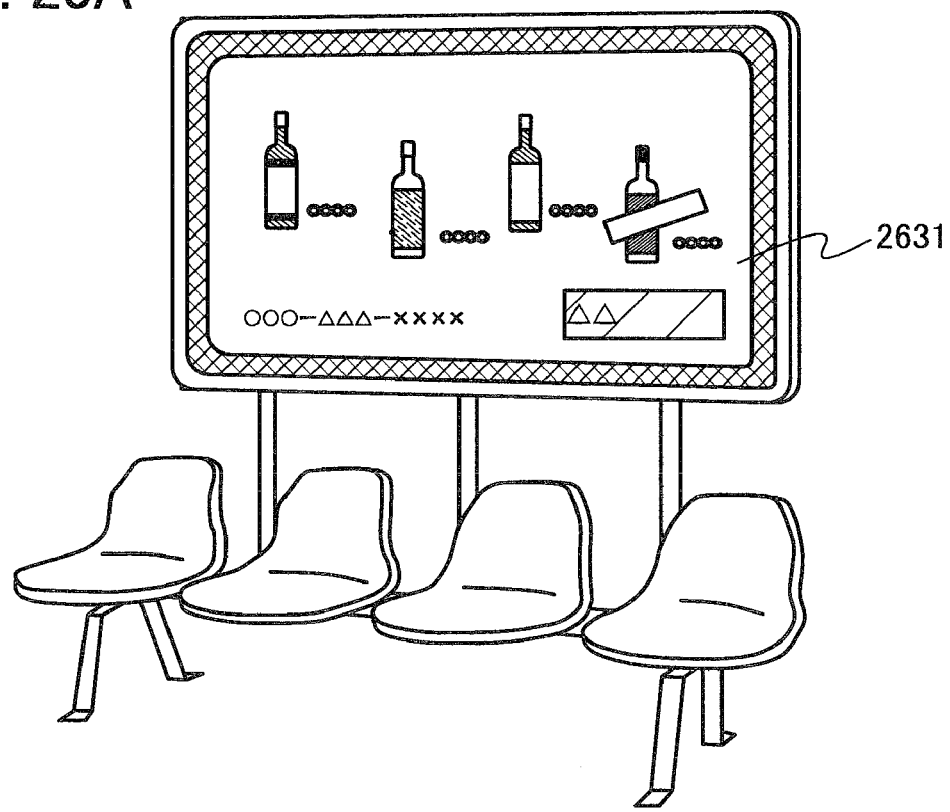
FIGS. 20A and 20B are views each illustrating an application of electronic paper.

FIG. 20A illustrates a poster 2631 using electronic paper. In the case where an advertising medium is printed paper, the advertisement is replaced by hands; however, by using electronic paper to which the present invention is applied, the advertising display can be changed in a short time. Further, stable images can be obtained without display defects. Note that the poster may have a configuration capable of wirelessly transmitting and receiving data.

Figure 20B:
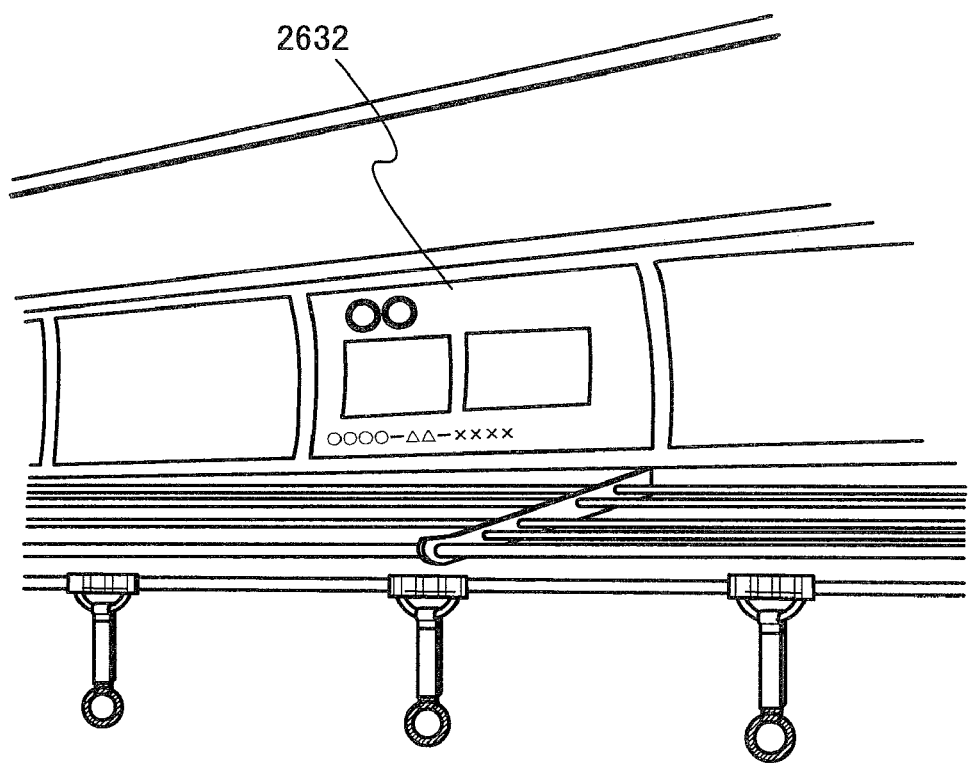

FIG. 20B illustrates an advertisement 2632 in a vehicle such as a train. In the case where an advertising medium is printed paper, the advertisement is replaced by hands; however, by using electronic paper to which the present invention is applied, the advertising display can be changed in a short time with less manpower. Further, stable images can be obtained without display defects. Note that the advertisement in a vehicle may have a configuration capable of wirelessly transmitting and receiving data.

Figure 21:
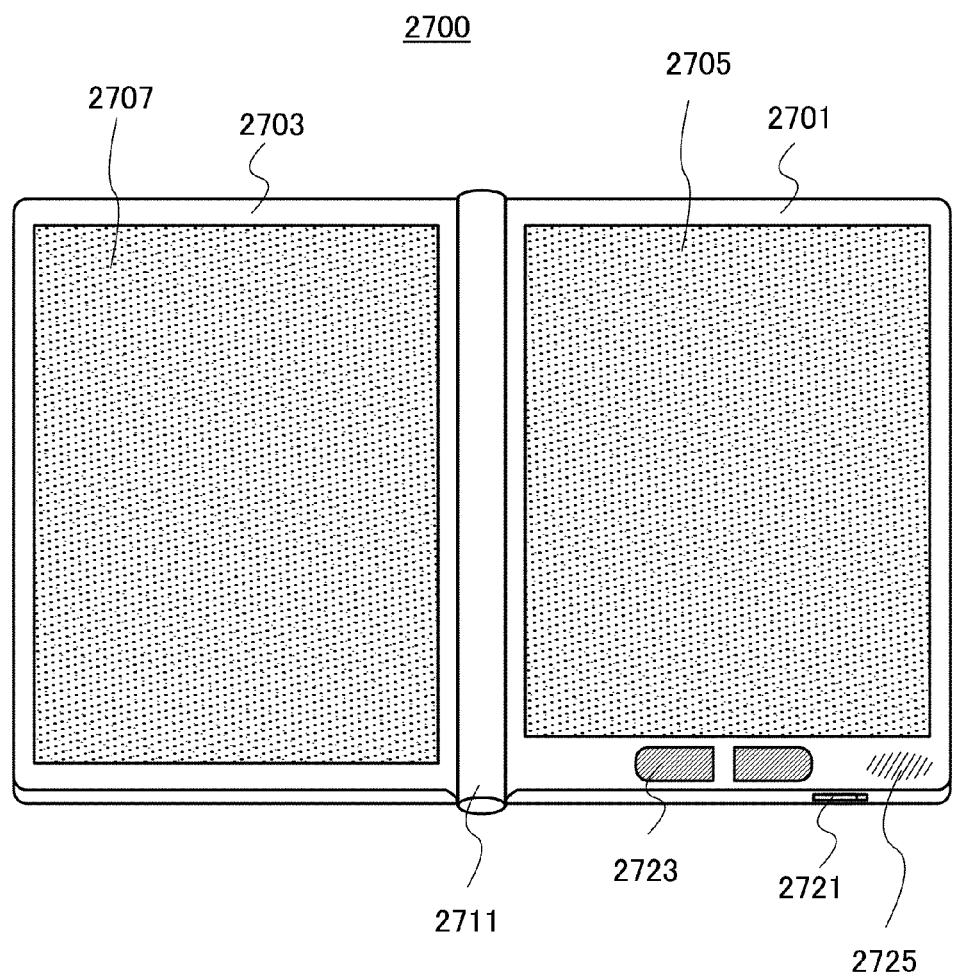
FIG. 21 is an external view illustrating an example of an e-book reader.

FIG. 21 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 21) and graphics can be displayed on a display portion on the left side (the display portion 2707 in FIG. 21).

FIG. 21 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in appropriate combination with the structures described in any one of Embodiments 1 to 3 or Embodiment 5.

Embodiment 9

A semiconductor device of the present invention can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 22A:
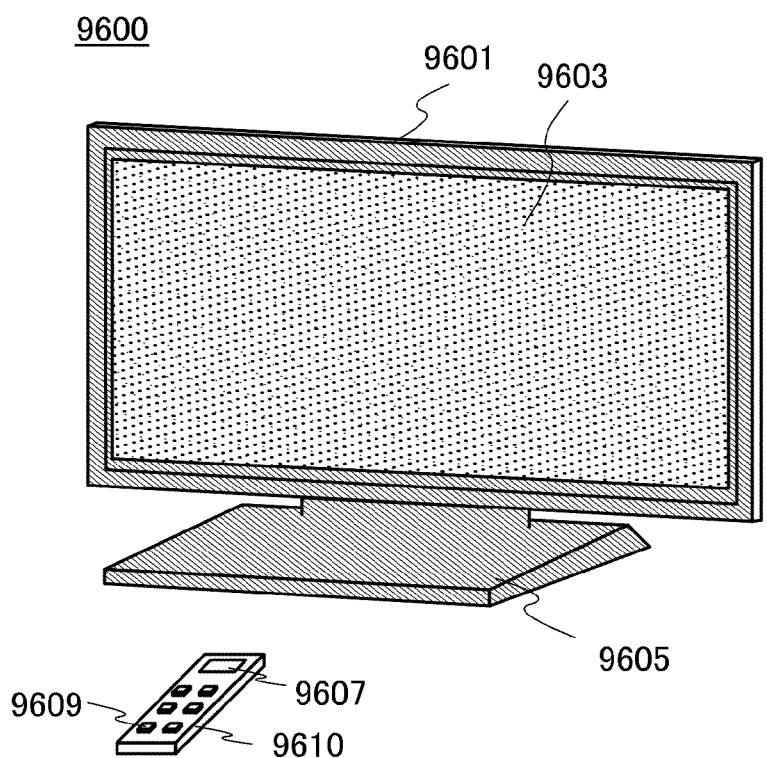
FIGS. 22A and 22B are external views illustrating a television set and a digital photo frame, respectively.

FIG. 22A illustrates an example of a television set 9600. In the television set 9600, a display portion 9603 is incorporated in a housing 9601. Images can be displayed on the display portion 9603. Further, the housing 9601 is supported by a stand 9605 here.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver, between receivers, or the like) data communication can be performed.

Figure 22B:
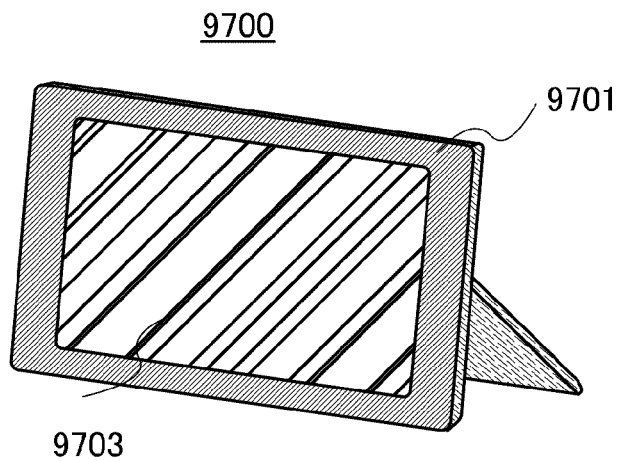

FIG. 22B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 23A:
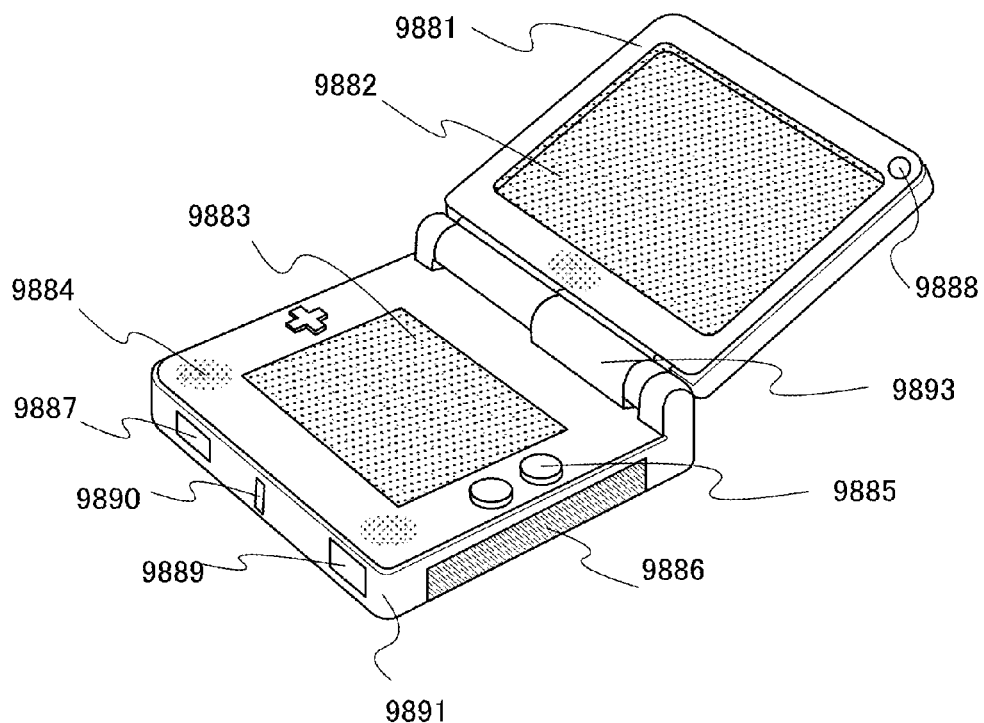
FIGS. 23A and 23B are external views each illustrating an example of an amusement machine.

FIG. 23A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 23A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and a structure provided with at least a semiconductor device of the present invention may be employed. The portable amusement machine may include other accessory equipment as appropriate. The portable amusement machine illustrated in FIG. 23A has a function of reading a program or data stored in a recording medium to display it on the display portion, and a function of sharing information with another portable amusement machine by wireless communication. The portable amusement machine illustrated in FIG. 23A can have various functions without limitation to the above.

Figure 23B:
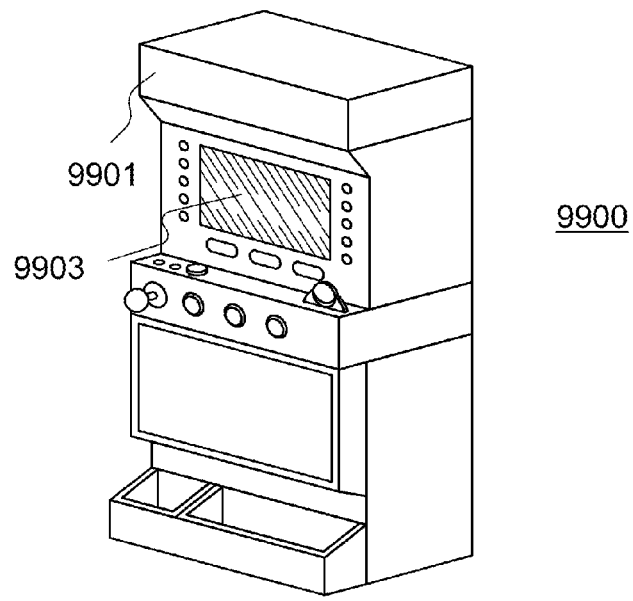

FIG. 23B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and a structure provided with at least a semiconductor device of the present invention may be employed. The slot machine 9900 may include other accessory equipment as appropriate.

Figure 24:
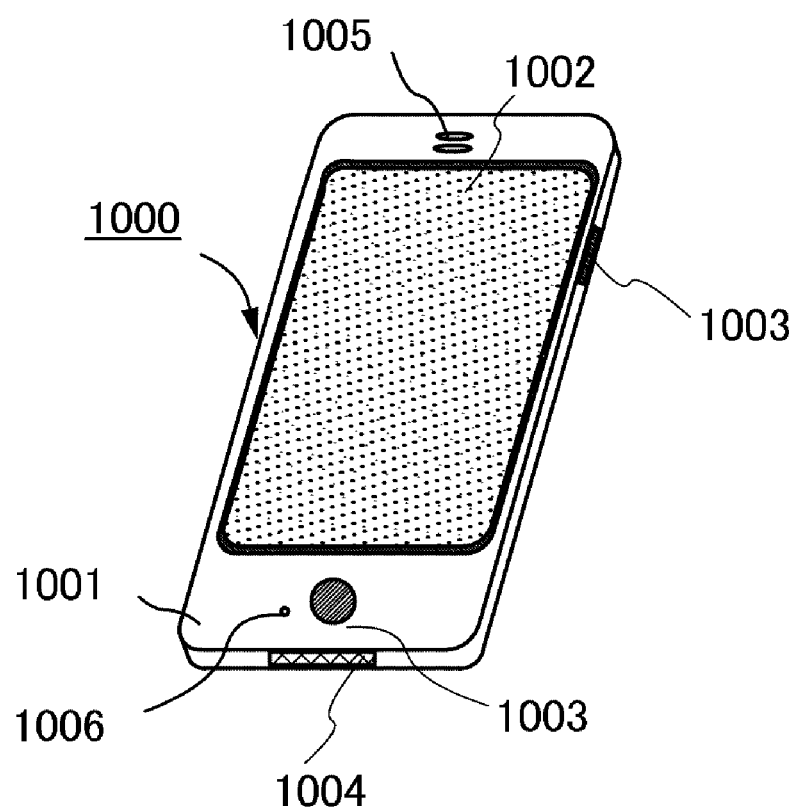
FIG. 24 is an external view illustrating a cellular phone.
Figure 25:
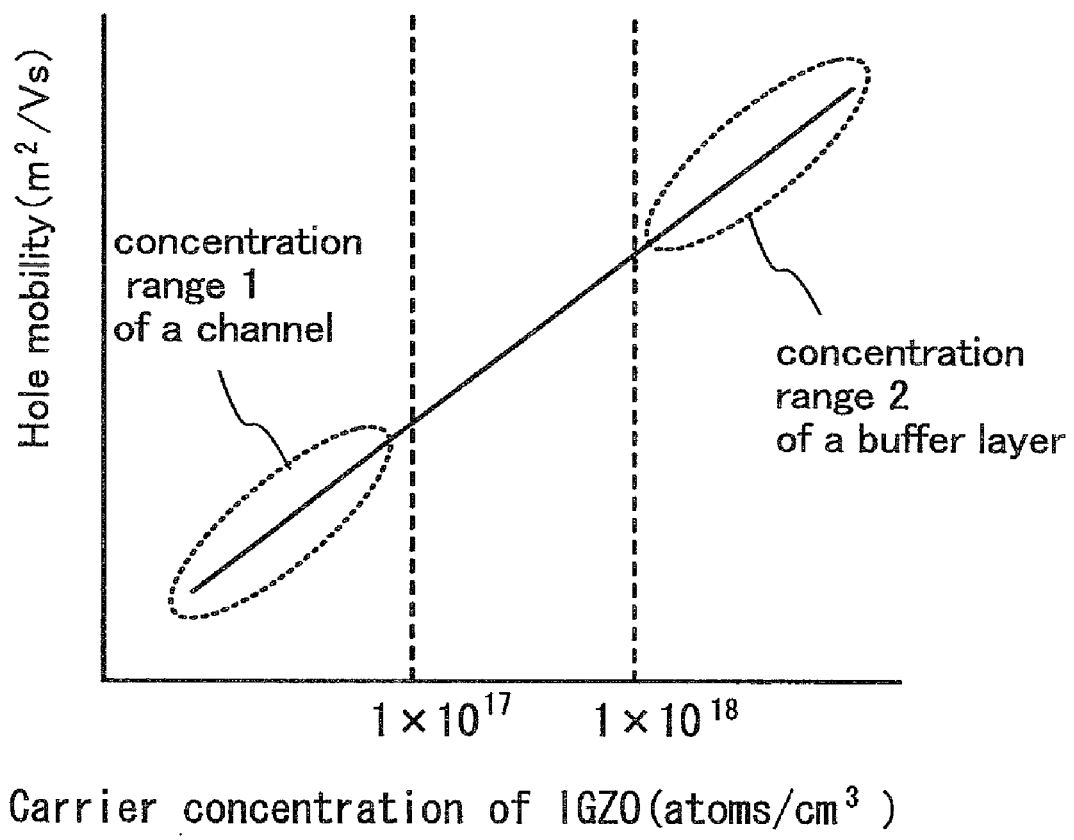
FIG. 25 is a graph showing the relationship between the hole mobility and the carrier density.

FIG. 24 illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 24 is touched with a finger or the like, data can be input into the mobile phone 1000. Further, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 stands upright or is laid down on its side).

The screen mode is switched by touching the display portion 1002 or operating the operation buttons 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Further, in the input mode, when input by touching the display portion 1002 is not performed for a certain period while a signal is detected by the optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can also be taken.

This application is based on Japanese Patent Application serial No. 2008-206125 filed with Japan Patent Office on Aug. 8, 2008, the entire contents of which are hereby incorporated by reference.

What is claimed is:

1. A semiconductor device including a thin film transistor, the thin film transistor comprising:
    a gate electrode layer;
    a gate insulating layer over the gate electrode layer;
    a source electrode layer and a drain electrode layer over the gate insulating layer;
    a first buffer layer having n-type conductivity over the source electrode layer;
    a second buffer layer having n-type conductivity over the drain electrode layer; and
    an oxide semiconductor layer over the first buffer layer and the second buffer layer,
    wherein the oxide semiconductor layer overlapping with the gate electrode layer is partly over and in contact with the gate insulating layer and is provided between the source electrode layer and the drain electrode layer,
    wherein a carrier concentration of the first buffer layer and the second buffer layer is higher than a carrier concentration of the oxide semiconductor layer,
    wherein the oxide semiconductor layer and the source electrode layer are electrically connected to each other with the first buffer layer interposed therebetween,
    wherein the oxide semiconductor layer and the drain electrode layer are electrically connected to each other with the second buffer layer interposed therebetween, and
    wherein a part of the first buffer layer and a part of the second buffer layer are in contact with the gate insulating layer in a region between the source electrode and the drain electrode.

2. The semiconductor device according to claim 1, wherein the first and second buffer layers include an impurity element imparting n-type conductivity.

3. The semiconductor device according to claim 1, wherein the oxide semiconductor layer has a carrier concentration less than $1 \times 10^{17}$ atoms/cm$^3$, and the first and second buffer layers have a carrier concentration of $1 \times 10^{18}$ atoms/cm$^3$ or more.

4. The semiconductor device according to claim 1, further comprising:
    a third buffer layer between the oxide semiconductor layer and the first buffer layer;
    a fourth buffer layer between the oxide semiconductor layer and the second buffer layer,
    wherein the third buffer layer having a carrier concentration higher than that of the oxide semiconductor layer and lower than that of the first buffer layer, and
    wherein the fourth buffer layer having a carrier concentration higher than that of the oxide semiconductor layer and lower than that of the second buffer layer.

5. The semiconductor device according to claim 1, wherein the source electrode layer and the drain electrode layer contain titanium.

6. The semiconductor device according to claim 1, wherein a side surface of the source electrode layer opposite to a side surface of the drain electrode layer is covered with the first buffer layer, and
    wherein the side surface of the drain electrode layer opposite to the side surface of the source electrode layer is covered with the second buffer layer.

7. The semiconductor device according to claim 1, wherein the oxide semiconductor layer contains indium, gallium, and zinc.

8. The semiconductor device according to claim 1, wherein the first and second buffer layers contain indium, gallium, and zinc.

9. The semiconductor device according to claim 1, wherein the first and second buffer layers contain magnesium, aluminum, or titanium.

10. A semiconductor device including a thin film transistor, the thin film transistor comprising:
    a gate electrode layer;
    a gate insulating layer over the gate electrode layer;
    a source electrode layer and a drain electrode layer over the gate insulating layer;
    a first buffer layer having n-type conductivity directly in contact with upper and side surfaces of the source electrode layer;
    a second buffer layer having n-type conductivity directly in contact with upper and side surfaces of the drain electrode layer; and
    an oxide semiconductor layer over the first buffer layer and the second buffer layer,
    wherein a part of the first buffer layer and a part of the second buffer layer are in contact with the gate insulating layer in a region between the source electrode and the drain electrode.

11. The semiconductor device according to claim 10, wherein the oxide semiconductor layer overlapping with the gate electrode layer is partly over and in contact with the gate insulating layer and is provided between the source electrode layer and the drain electrode layer.

12. The semiconductor device according to claim 10, wherein a carrier concentration of the first buffer layer and the second buffer layer is higher than a carrier concentration of the oxide semiconductor layer.

13. The semiconductor device according to claim 10, wherein the oxide semiconductor layer and the source electrode layer are electrically connected to each other with the first buffer layer interposed therebetween, and
    wherein the oxide semiconductor layer and the drain electrode layer are electrically connected to each other with the second buffer layer interposed therebetween.

14. The semiconductor device according to claim 10, wherein the oxide semiconductor layer contains indium, gallium, and zinc.

15. The semiconductor device according to claim 10, wherein the first and second buffer layers contain indium, gallium, and zinc.

16. The semiconductor device according to claim 10, wherein the first and second buffer layers contain magnesium, aluminum, or titanium.

* * * * *